(12) United States Patent
Mücke et al.

(10) Patent No.: US 11,360,142 B2
(45) Date of Patent: *Jun. 14, 2022

(54) APPARATUS AND METHOD FOR PROVIDING A SUPPLY VOLTAGE TO A DEVICE UNDER TEST USING A COMPENSATION SIGNAL INJECTION

(71) Applicant: Advantest Corporation, Tokyo (JP)

(72) Inventors: Martin Mücke, Stuttgart (DE); Peter Horvath, Ehningen (DE)

(73) Assignee: Advantest Corporation, Tokyo (JP)

( * ) Notice: Subject to any disclaimer, the term of this patent is extended or adjusted under 35 U.S.C. 154(b) by 153 days.

This patent is subject to a terminal disclaimer.

(21) Appl. No.: 16/574,632

(22) Filed: Sep. 18, 2019

(65) Prior Publication Data

US 2020/0011926 A1 Jan. 9, 2020

Related U.S. Application Data

(63) Continuation of application No. PCT/EP2017/057688, filed on Mar. 31, 2017.

(51) Int. Cl.
  *G01R 31/28* (2006.01)
  *G05F 1/46* (2006.01)

(52) U.S. Cl.
  CPC ........ *G01R 31/2832* (2013.01); *G05F 1/46* (2013.01)

(58) Field of Classification Search
  None
  See application file for complete search history.

(56) References Cited

U.S. PATENT DOCUMENTS

| | | | | |
|---|---|---|---|---|
| 4,646,299 | A * | 2/1987 | Schinabeck | G01R 31/3191 324/73.1 |
| 5,059,889 | A * | 10/1991 | Heaton | G05F 1/575 323/285 |
| 5,579,236 | A | 11/1996 | Tamamura et al. | |
| 5,917,331 | A * | 6/1999 | Persons | G01R 31/3004 324/762.02 |
| 6,262,670 | B1 * | 7/2001 | Ballou | G01R 19/0053 324/162 |
| 7,256,603 | B1 * | 8/2007 | Wang | G01R 1/36 324/762.02 |
| 7,352,193 | B2 * | 4/2008 | Nakahara | G01R 31/30 324/713 |
| 7,538,539 | B1 * | 5/2009 | Balke | G01R 15/08 324/115 |

(Continued)

*Primary Examiner* — Thomas J. Hiltunen

(57) ABSTRACT

An apparatus for providing a supply voltage to a device under test includes: a controlled source; a switchable resistor circuited between the output of the controlled source and a dut port, having a comparatively smaller first resistance in a first switch state and a second resistance in a second switch state; a regulator that provides a control signal to the controlled source, to regulate a voltage to be provided to the dut. The apparatus changes a switch state of the switchable resistor while a voltage is provided to the dut via the switchable resistor. The apparatus injects a compensation signal into a control loop including the regulator, the controlled source and the switchable resistor, to thereby cause a change of the voltage provided by the controlled source, to at least partially compensate a change of a voltage drop across the switchable resistor.

24 Claims, 15 Drawing Sheets

(56) References Cited

U.S. PATENT DOCUMENTS

| | | | |
|---|---|---|---|
| 7,903,008 B2 * | 3/2011 | Regier | G01R 31/2841 |
| | | | 341/142 |
| 9,207,282 B2 * | 12/2015 | Faehnrich | G01R 31/31924 |
| 9,318,955 B2 * | 4/2016 | Shimizu | G05F 1/00 |
| 10,778,212 B1 * | 9/2020 | D'Aquino | H03K 17/162 |
| 2009/0121908 A1 | 5/2009 | Regier | |
| 2011/0109300 A1 | 5/2011 | Vulovic et al. | |
| 2012/0306517 A1 | 12/2012 | Regier et al. | |
| 2014/0009129 A1 | 1/2014 | Shimizu et al. | |
| 2020/0011928 A1 * | 1/2020 | Mucke | G01R 31/31721 |

\* cited by examiner

APPARATUS AND METHOD FOR PROVIDING A SUPPLY VOLTAGE TO A DEVICE UNDER TEST USING A COMPENSATION SIGNAL INJECTION

CROSS-REFERENCE TO RELATED APPLICATION

This application is a continuation of copending International Application No. PCT/EP2017/057688, filed Mar. 31, 2017, which is incorporated herein by reference in its entirety.

Embodiments of the present invention relate to providing a supply voltage to a device under test.

BACKGROUND OF THE INVENTION

For conventional concepts a digital loop is used to control an output voltage or a device under test voltage. FIG. 14 shows a block diagram of an apparatus for providing a supply voltage to a device under test with two current measurement ranges. However, when switching from one current measurement range to another measurement range, for example Range 1 to Range 2 in FIG. 14, a glitch is generated at a device under test port. Furthermore, FIG. 15 shows a block diagram of an apparatus according to another conventional approach for providing a supply voltage to a device under test. The apparatus in FIG. 15 has switches which are operated in a "make before break" order. The switches are built to work "slow". This means that they do not operate instantaneously, i.e., their change of resistance is "slow". Given that the changes of the switches are slow enough, the loop may be able to follow a voltage change at resistors. However, it has been found that a control of the loop has to be faster than a glitch. However, it has been found that a complete cancellation is difficult as a full control over the switch resistance is difficult.

In U.S. Pat. No. 5,579,236 a voltage/current measuring unit and method are disclosed.

In US 2011/0109300 A1 a multi-range electrical current measurement is disclosed.

In US 2014/0009129 A1 a power supply apparatus for testing apparatus is disclosed.

In light of the above mentioned conventional concepts, a need exists for an improved concept for providing a supply voltage to a device under test.

SUMMARY

According to an embodiment, an apparatus for providing a supply voltage to a device under test may have: a controlled source configured to provide a voltage in dependence on one or more control signals; a switchable resistor circuited between the output of the controlled source and a device under test port, having a first resistance in a first switch state and a second resistance in a second switch state, wherein the second resistance is smaller than the first resistance; a regulator configured to provide a control signal to the controlled source, to regulate a voltage to be provided to the device under test in dependence on an information about a desired voltage; wherein the apparatus is configured to change a switch state of the switchable resistor while a voltage is provided to the device under test via the switchable resistor; wherein the apparatus is configured to inject a compensation signal into a control loop including the regulator, the controlled source and the switchable resistor, to thereby cause a voltage change of the voltage provided by the controlled source, to at least partially compensate a change of a voltage drop across the switchable resistor which is caused by changing the switch state of the switchable resistor.

According to another embodiment, a method for providing a supply voltage to a device under test may have the steps of: providing a voltage in dependence on one or more control signals by a controlled source; wherein a switchable resistor is circuited between the output of the controlled source and a device under test port, having a first resistance in a first switch state and a second resistance in a second switch state, wherein the second resistance is smaller than the first resistance; providing a control signal by a regulator to the controlled source, to regulate a voltage to be provided to the device under test in dependence on an information about a desired voltage; changing a switch state of the switchable resistor while a voltage is provided to the device under test via the switchable resistor; injecting a compensation signal into a control loop including the regulator, the controlled source and the switchable resistor, to thereby cause a voltage change of the voltage provided by the controlled source, at least partially compensating a change of a voltage drop across the switchable resistor which is caused by changing the switch state of the switchable resistor.

Embodiments provide an apparatus for providing a supply voltage to a device under test. The apparatus comprises a controlled source (e.g., a voltage source) configured to provide a voltage in dependence on one or more control signals. The apparatus comprises a switchable resistor (e.g. a switchable resistor arrangement, a measurement shunt) circuited between the output of the controlled source and a device under test port. The switchable resistor has a first resistance in a first switch state and a second resistance in a second switch state, wherein the second resistance is smaller than the first resistance. For example, the switchable resistor is configured to allow for a measurement of a current within a specified range to the device under test port, wherein a measurement range can be adjusted by switching the switch states. For example, by using a specified resistance, e.g., the first resistance or the second resistance, a specified current range can be provided to measure a device under test current. The apparatus comprises a regulator configured to provide a control signal (e.g., in dependence of a set point value (desired voltage) and an observed voltage at the device under test port) to the controlled source to regulate a voltage to be provided to the device under test (e.g. a voltage at the device under test port) in dependence on an information about a desired voltage. For example, the regulator may be configured to provide the control signal such that a difference between a set point voltage and the device under test port voltage is small. The apparatus is further configured to change a switch state of the switchable resistor while a voltage (or a current) is provided to the device under test via the switchable resistor. Moreover, the apparatus is configured to inject a (e.g., feed forward) compensation signal (e.g. active compensation signal) into a control loop comprising the regulator, the controlled source and the switchable resistor, to thereby cause a voltage change of the voltage provided by the controlled source. The change of the voltage provided by the controlled source is configured to at least partially compensate a change of a voltage drop across the switchable resistor which is caused by changing the switch state of the switchable resistor. For example, to counteract a glitch which would be caused by changing a switch state of the switchable resistor in the absence of the injection of the compensation signal.

The described apparatus is based on the insight that a control of the voltage at the device under test port may not be fast enough to compensate a glitch when changing a state of the switchable resistor when performed only using a feedback from the device under test port. In particular, when a switch state of the switchable resistor is changed, an effective resistance of the switchable resistor is changed leading to a changed voltage drop across the switchable resistor. The changed voltage drop propagates to (or affects) the device under test port (leading to a so-called glitch at the device under test port) if proper countermeasures are not provided (thereby, a device under test may be damaged when it is connected to the device under test port and is subjected to a voltage which is beyond its specification). The described embodiments are therefore based on the idea to use a (for example an a-priori) knowledge about a change of a resistance due to a switching of the switch state, to provide an appropriate compensation signal countering a changed voltage drop across the switchable resistor and therefore at the device under test port. Further, the injected compensation signal leads to a faster compensation of a changed voltage drop than a conventional control through the feedback loop. The compensation signal, which is used in addition to the feedback from the device under test port, leads to the controlled source outputting an output voltage which accommodates for the changed voltage drop across the switchable resistor. Thereby, a glitch, i.e., a change of voltage at the device under test port, can be substantially inhibited or avoided. In other words, a voltage at the device under test port may for example stay within ±5% when changing a switch state of the switchable resistor. Moreover, the apparatus is configured to provide a voltage to the device under test via the switchable resistor even during switching. Maintaining the power supply to the device under test via the switchable resistor, which may also be used as a measurement shunt, may enable measurement with little breaks or pauses due to switching. Moreover, the described embodiment does not need an auxiliary power source to provide a voltage to the device under test when switching a switch state.

In embodiments, the apparatus is configured to inject a negative compensation signal into the control loop, to thereby increase an output voltage of the controlled source when switching the switchable resistor from the first resistance of the first switch state to the second resistance of the second switch state. As the device under test is assumed to have a constant voltage and the second resistance is smaller than the first resistance, a series circuit of the second resistance with the device under test has a lower overall voltage than a series circuit of the first resistance with the device under test. Therefore, a negative compensation signal leading to a decreased output voltage of the controlled source accommodates the lower overall voltage. Moreover, by means of the compensation signal the lower overall voltage is achieved faster (e.g. instantaneously given perfect timing) than only using regulation over the control loop.

In embodiments, the apparatus is configured to inject a positive compensation signal into the control loop, to thereby increase an output voltage of the controlled source when switching the switchable resistor from the second resistance of the second switch state to the first resistance of the first switch state. Switching from the second switch state to the first switch state leads to a series circuit of the first resistance with the device under test which will lead to an increased voltage drop across the switchable resistor (and overall voltage drop (voltage drop of series circuit of switchable resistor and device under test)) which is accommodated by an increased output voltage of the controlled source. Moreover, by means of the compensation signal the higher overall voltage is achieved faster (e.g. instantaneously given perfect timing) than only using regulation over the control loop.

In embodiments, the apparatus is configured to inject the compensation signal into a node of the control loop which is different from the device under test port. By using a different node which is different from the device under test port a power supply for the device under test via the switchable resistor may be ensured. Therefore, no additional power source may be used to supply the device under test.

In embodiments, the apparatus is configured to inject a compensation signal into a digital part of the control loop. By injecting the compensation signal into a digital part of the control loop one may use a fully digital design of the compensation signal (and the regulator) with increased flexibility, for example by programmability of arbitrary compensation signals.

In embodiments, the apparatus is configured to add the compensation signal to an error signal of the control loop and to provide the error signal to the regulator. The error signal may characterize a deviation from a set point which is used by the regulator to control the device under test port voltage. However, using conventional control through the control loop leads to slow regulation of the voltage at the device under test port, therefore, modifying the error signal by adding the compensation signal leads to a faster response to known changes in a system (e.g. changing the switch state of the switchable resistor).

In embodiments, the apparatus is configured to inject the compensation signal into the control loop, such that the compensation signal does not directly affect the voltage or a current at the device under test port. Thus, the compensation signal indirectly at least partially compensates a change of a voltage drop across the switchable resistor which is caused by changing the switch state of the switchable resistor. Indirectly affecting a voltage or a current of the device under test port is beneficial as an injection of the compensation signal may be facilitated in an arbitrary node of the apparatus which does not directly affect the device under test port and therefore offers flexibility in choosing an injection node. Moreover, for example, an electrical isolation may be provided between the compensation signal and the device under test, by not directly affecting the voltage at the device under test port thereby.

In embodiments, the switchable resistor has a first switch arranged in series with a first resistor having the first resistance and a second switch arranged in series with a second resistor having the second resistance. Moreover, the switchable resistor is configured to close the first switch and open the second switch in the first switch state. Further, the switchable resistor is further configured to open the first switch and close the second switch in the second switch state. Furthermore, the switchable resistor is configured to allow for a parallel connection of the first resistor and the second resistor in an intermediate switch state when the first switch and the second switch are closed. Using the described switchable resistor design enables simple and cost efficient implementation of the switchable resistor using e.g. relays and resistors.

In embodiments, the apparatus comprises a capacitor circuited in parallel to the switchable resistor at least during changing a switch state of the switchable resistor. Coupling a capacitor in parallel to the switchable resistor helps in avoiding a fast voltage change over the switchable resistor and thereby at the device under test port. Thereby, timing accuracy of the injection of the compensation signal and speed of the regulation of the control loop becomes less significant. In other words, a simpler regulator may be used and relaxation of timing requirement for the compensation signal may be achieved.

In embodiments the apparatus is configured to bring a voltage of the capacitor towards a voltage drop of the switchable resistor in a stationary state of the switchable resistor. By bringing a voltage of the capacitor towards a voltage of the switchable resistor, a capacitor is charged and may be used for avoiding a large voltage change across the switchable resistor when coupled in parallel to the switchable resistor as a voltage across a capacitor is continuous even during switching (neglecting parasitic resistance effects of a capacitor).

In embodiments the apparatus is configured to parallel connect the capacitor with the switchable resistor via a resistance having a resistance value which is larger than or equal to ten times a resistance of the switchable resistor in a stationary state of the switchable resistor prior to switching a state of the switchable resistor. By coupling the capacitor through a higher resistance to the switchable resistor when not switching the switchable resistor reduces its influence on the switchable resistor. For example, when using the switchable resistor as a measurement shunt fidelity of the voltage across the switchable resistor should be high. As a directly coupled capacity decreases a speed at which a voltage may change over the switchable resistor, fast voltage changes may not be observed for the purpose of measurement, which is not a desired behavior for fast measurements. In other words, when measuring a voltage across a switchable resistor an influence of the capacitor on the measurements should be small which is achieved through coupling the capacitor through a high resistance.

In embodiments the apparatus is configured to couple the capacitor in parallel with the switchable resistor via an electrical path having a resistance of at most a tenth of a smaller resistance of the first resistance of the first switch state and of the second resistance of the second switch state at least when switching the switchable resistor. Coupling the capacitor in parallel through a small resistance when switching the switchable resistor enables the capacitor to slow a voltage change over the switchable resistor effectively. Having the capacitor coupled with low resistance to the switchable resistor its charge enables to slow a change of the voltage across the switchable resistor. Therefore, having the capacitor coupled through a small resistance in series with the capacitor effectively only leads to the voltage across the switchable resistor being mainly determined by the capacitors charge.

In embodiments the apparatus is configured to decouple the capacitor from the switchable resistor in a stationary state of the switchable resistor. The apparatus further comprises a measurement unit configured to measure a voltage across the switchable resistor when the capacitor is decoupled. Having the capacitor decoupled from the switchable resistor during measurement leads to measurement results which are unaffected by the capacitor.

Therefore, measurements of fast voltage (or current) changes, e.g., in small voltage ranges, can be performed more accurately.

In embodiments the apparatus is configured to couple the capacitor in parallel to the switchable resistor via an electrical path with low resistance when switching the switchable resistor. Moreover, the capacitor has a capacitance configured to slow a voltage change of the device under test port when switching the switchable resistor such that the voltage change is substantially inhibited at the device under test port based on the control signal. When the capacitor is circuited in parallel to the switchable resistor via a low resistance path its charge can counteract a voltage change across the switchable resistor. Moreover, when the capacitors has a high capacitance a large charge can be kept in the capacitor which takes a longer time to discharge countering a fast voltage change. Therefore, a voltage change over the switchable resistor due to switching of the switchable resistor is substantially slowed. This is due to the increased charge stored in a capacitor with a large capacitance which slowly discharges upon change of a voltage across the capacitor. Moreover, a capacitor with a high capacitance discharges or charges slower than a capacitor with a small capacitance spreading the voltage change over a longer time frame. Due to the slow voltage change at the switchable resistor the regulator may easier be able to follow the voltage change such that no voltage change or only a small voltage change is observable at the device under test port. Moreover, a slower control may be employed using a cheap regulator.

In embodiments the apparatus is configured to inject a compensation signal having an exponential decay and overshoot at the beginning of the exponential decay. The overshoot is configured to compensate a voltage step caused by the switchable resistor when switching the switchable resistor and the exponential decay component of the compensation signal is configured to at least partially compensate a temporally variable voltage of the capacitor. The described apparatus can beneficially compensate a voltage change at the switchable resistor when a capacitor is circuited in parallel. Moreover, it is specifically suitable for switching from a high resistance, e.g., the first resistance to an intermediate resistance which is small, wherein the overshoot compensates for the big voltage change due to the change from a high resistance to a small resistance. While in the intermediate state the capacitor is discharging which is compensated by the exponential decay component leading to a substantially constant voltage at the device under test port. When the capacitor is sufficiently discharged, i.e., a voltage across the capacitor is similar to a voltage across the switchable resistor in the second switch state, the switchable resistor switches from the intermediate state to the second switch state. Thereby, the described apparatus can effectively compensate voltage changes across the switchable resistor when switching such that only minimal voltage changes are observable at the device under test port.

In embodiments the switchable resistor is configured to switch from the first switch state, in which the first resistance is effective, to the second switch state, in which the second resistance is effective, by an intermediate switch state in which a resistance smaller than the second resistance is effective (for example, when the first resistance and the second resistance are circuited in parallel during the intermediate state). The apparatus is further configured to inject a compensation signal having an exponential decay and an overshoot at the beginning of the exponential decay into an integrating portion of the regulator when switching from the first switch state to the second switch state (e.g. via the intermediate state). Furthermore, the overshoot is configured to at least partially compensate a voltage step caused by switching the switchable resistor from the first switch state to the intermediate switch state and the exponential decay component of the compensation signal is configured to at least partially compensate a temporally variable voltage across the capacitor. The described apparatus can effectively control the voltage change at the switchable resistor such that only a minimum voltage change is observed at the device under test port. Moreover, the overshoot which is a weighted unit impulse as input to the integrating portion of the regulator leads to a step response out of the regulator which is configured to compensate the voltage step introduced from switching from a high resistance to a small resistance, i.e., from the first state to the intermediate state. Furthermore, the exponential decay keeps its shape after integration and effectively counters the discharge of the capacitor which follows in general an exponential shape.

In embodiments the switchable resistor is configured to switch from the second switch state, in which the second resistance is effective, to the first switch state, in which the first resistance is effective, via an intermediate switch state in which an effective resistance (of the switchable resistor) is larger than the first resistance (for example, an infinite resistance or both resistances (first resistance and second resistance) are disabled in the intermediate state). Furthermore, the apparatus is configured to inject a compensation signal having a rectangular shape into an integrating portion of the regulator when switching from the second switch state to the first switch state (via the intermediate state) (e.g., during a time in which the intermediate state is active) to at least partially compensate a temporally variable voltage across the capacitor (e.g. linear charging of the capacitor). Due to integration the rectangular shape leads to a control signal with a linear slope which may be used for linearly charging the capacitor (e.g., wherein a current (provided through the output voltage of the controlled source) is completely flowing into the capacitor as the switchable resistor might be in an infinite resistance state in the intermediate state). After a sufficient time the capacitor reaches a voltage corresponding to a voltage over the switchable resistor in a first switch state such that the switchable resistor might be switched into the first switch state without change of the voltage across the capacitor.

In embodiments the switchable resistor comprises an intermediate switch state, wherein an effective resistance in the intermediate switch state is larger than the first resistance in the second resistance. Moreover, the apparatus is configured to switch the switchable resistor into the intermediate switch state in between switching from the second switch state to the first switch state. Using an intermediate switch state with a high or infinite resistance leads to a current provided by the controlled source only flowing into the capacitor (or majorly flowing into the capacitor) when the capacitor is coupled in parallel to the switchable resistor. Moreover, the capacitor keeps the voltage across the switchable resistor and only slowly changes its voltage drop. As a provided current is exclusively or mostly flowing through the capacitor, the capacitor can be charged quickly while a voltage change across the switchable resistor is continuous.

In embodiments the apparatus is configured to discharge the capacitor when switching from the first switch state to the second switch state or to charge the capacitor when switching from the second switch state to the first switch state such that a change of an output voltage of the controlled source (which is caused by the injection signal) at least partially compensates a change of the voltage across the capacitor, thereby avoiding that the change of a voltage across the capacitor results in a large change of the device under test port voltage.

In embodiments the switchable resistor comprises an intermediate switch state, wherein an effective resistance in the intermediate switch state is smaller than the first resistance and the second resistance. Moreover, the apparatus is configured to switch the switchable resistor into the intermediate switch state in between switching from the second switch state to the first switch state. Using the described intermediate switch state a continuous power supply may be provided to the device under test port, for example without breaking a connection between the device under test and the power supply when switching.

In embodiments the apparatus comprises a measurement unit configured to measure a voltage across the switchable resistor. The described apparatus can beneficially use the first and the second resistance which values are known to compute a current flowing through the switchable resistor based on the measured voltage across the switchable resistor. Thereby, a current flowing into the device under test can be monitored and used to detect defective devices under test. Moreover, using the first resistance and the second resistance having different resistance values, variable current ranges can be monitored and/or provided.

In embodiments the apparatus is configured to provide the control signal to the regulator based on an error signal. The error signal is based on a difference between a measured voltage of the device under test port and the information about a desired voltage. Using the described error signal the apparatus can flexibly adjust the provided voltage by the controlled source in order to minimize the error signal when the error signal characterizes a deviation from the device under test port voltage to a desired voltage.

In embodiments the regulator is configured to provide the control signal using an integration of the error signal. Using an integration of the error signal brings stability to the control as large errors due to noisy measurement are averaged and are therefore attenuated.

In embodiments the controlled source is configured to provide an output voltage based on the control signal in a current state such that through a feedback over the control loop an error signal's absolute value is reduced in a future state. A current state may be in a first time frame and a future state in a second time frame, wherein the second time frame follows the first time frame in time. Using analog control the time frames may distanced only by some picoseconds or femtoseconds or when using digital control the time frames are more likely distanced by milliseconds. Moreover, the described recursion provides stability as an error of the output is minimized avoiding large errors.

Embodiments provide a method for providing a supply voltage to a device under test. The method comprises providing a voltage in dependence on one or more control signals by a controlled source. Moreover, a switchable resistor is circuited between the output of the controlled source and a device under test port, having a first resistance in a first switch state and a second resistance in a second switch state, wherein the second resistance is smaller than the first resistance. The method further comprises providing a control signal by a regulator to the controlled source, to regulate a voltage to be provided to the device under test and dependence on an information about a desired voltage. Further, the method comprises changing a switch state of the switchable resistor while a voltage is provided with the device under test via the switchable resistor. Moreover, the method comprises injecting a compensation signal into a control loop comprising the regulator, the controlled source and the switchable resistor. Thereby, a voltage change of the voltage provided by the controlled source is caused. The method comprises at least partially compensating a change of a voltage drop across a switchable resistor which is caused by changing the switch state of the switchable resistor. The method can be supplemented by all features and functionalities described herein with respect to the apparatus.

BRIEF DESCRIPTION OF THE DRAWINGS

Embodiments of the present invention will be detailed subsequently referring to the appended drawings, in which.

DETAILED DESCRIPTION OF THE INVENTION

In the following same references are used throughout various figures to indicate similar or identical properties of the referenced items.

Figure 1:
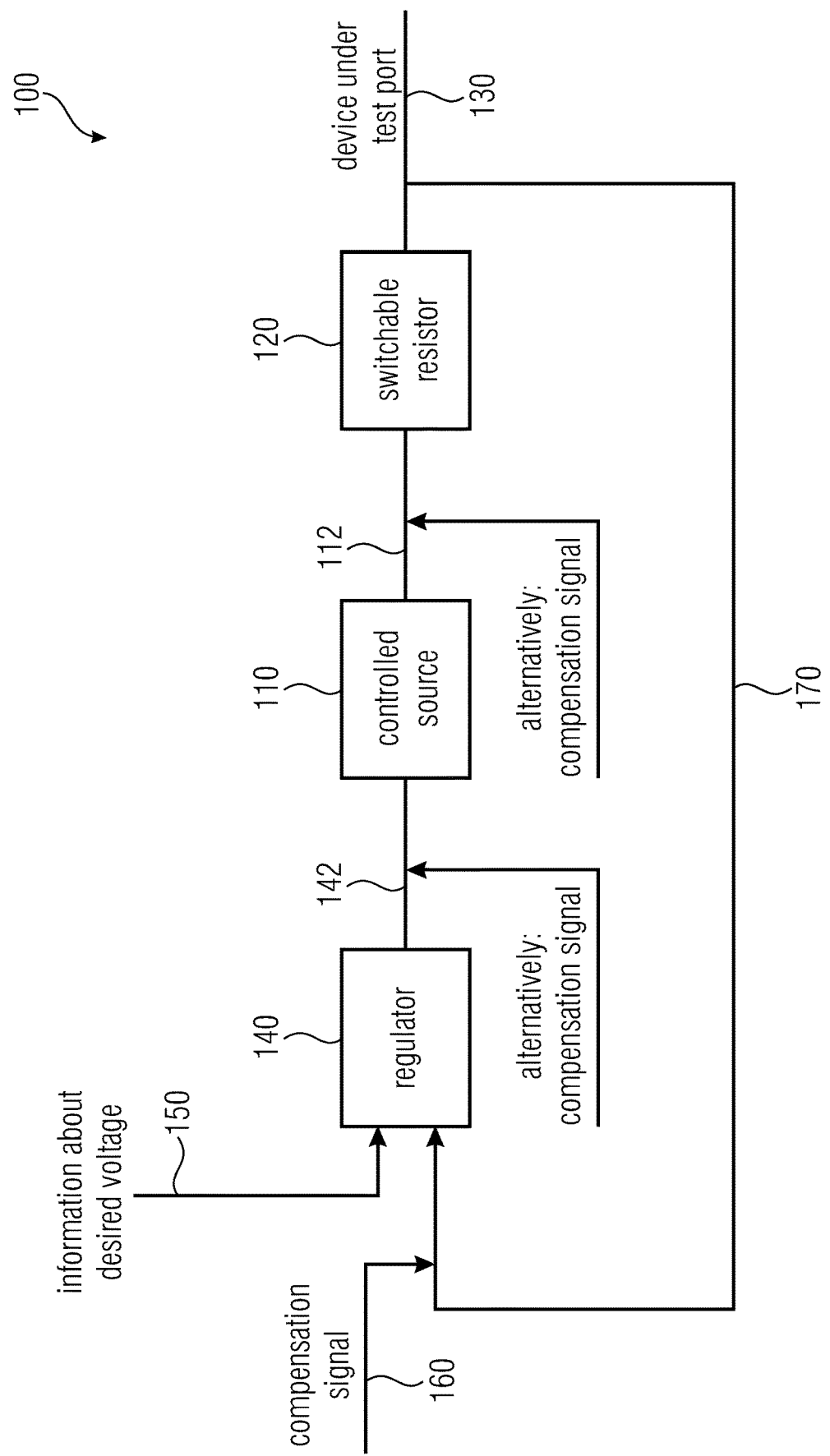
FIG. 1 shows a block diagram of an apparatus for providing a supply voltage to a device under test according to embodiments of the invention.

FIG. 1 shows a block diagram of an apparatus 100 for providing a supply voltage to a device under test according to embodiments of the invention. The apparatus 100 comprises a controlled source 110, a switchable resistor 120, a regulator 140 and a device under test port 130. The regulator 140, the controlled source 110 and the switchable resistor 120 are arranged in a control loop 170.

The control loop 170 feeds back a measurement of a voltage at the device under test port 130 to the regulator 140. Before entering the regulator 140 a compensation signal 160 is injected into the control loop (wherein the compensation signal may also be injected between the regulator 140 and the controlled source 110 or between the controlled source 110 and the switchable resistor 120). Based on the information obtained through the control loop and an information about a desired voltage 150 the regulator 140 provides a control signal 142 to the controlled source 110. Based on the control signal 142 the controlled source 110 provides an output voltage 112 via the switchable resistor 120 to the device under test port 130. Through the control loop 170 the regulator 140 adjusts the control signal 142 such that a voltage of the device under test port 130 matches a desired voltage. Moreover, the switchable resistor 120 can change its resistance to adjust for a desired current range. However, changing the resistance in the switchable resistor 120 leads to a change of a voltage drop across the switchable resistor 120. For example, based on knowledge about the resistance values of the switchable resistor the compensation signal 160 is designed such that it acts to counter a change of a voltage drop across the switchable resistor 120 by steering the controlled source 110. Thereby, a voltage at the device under test port 130 can be kept substantially constant or kept within ±5% of the desired voltage.

The apparatus 100 is based on the idea that knowledge about the switching time and resistance values of the switchable resistor 120 can be used to design an appropriate compensation signal 160 such that a change of a voltage drop across the switchable resistor 120 can be effectively compensated by (quickly) changing the output voltage 112 of the controlled source 110 using the compensation signal. Thereby, fast switching can be achieved, e.g., for fast measurements of devices under test. The described apparatus 100 can optionally be supplemented by any of the features or functionalities described herein either individually or in combination.

Figure 2:
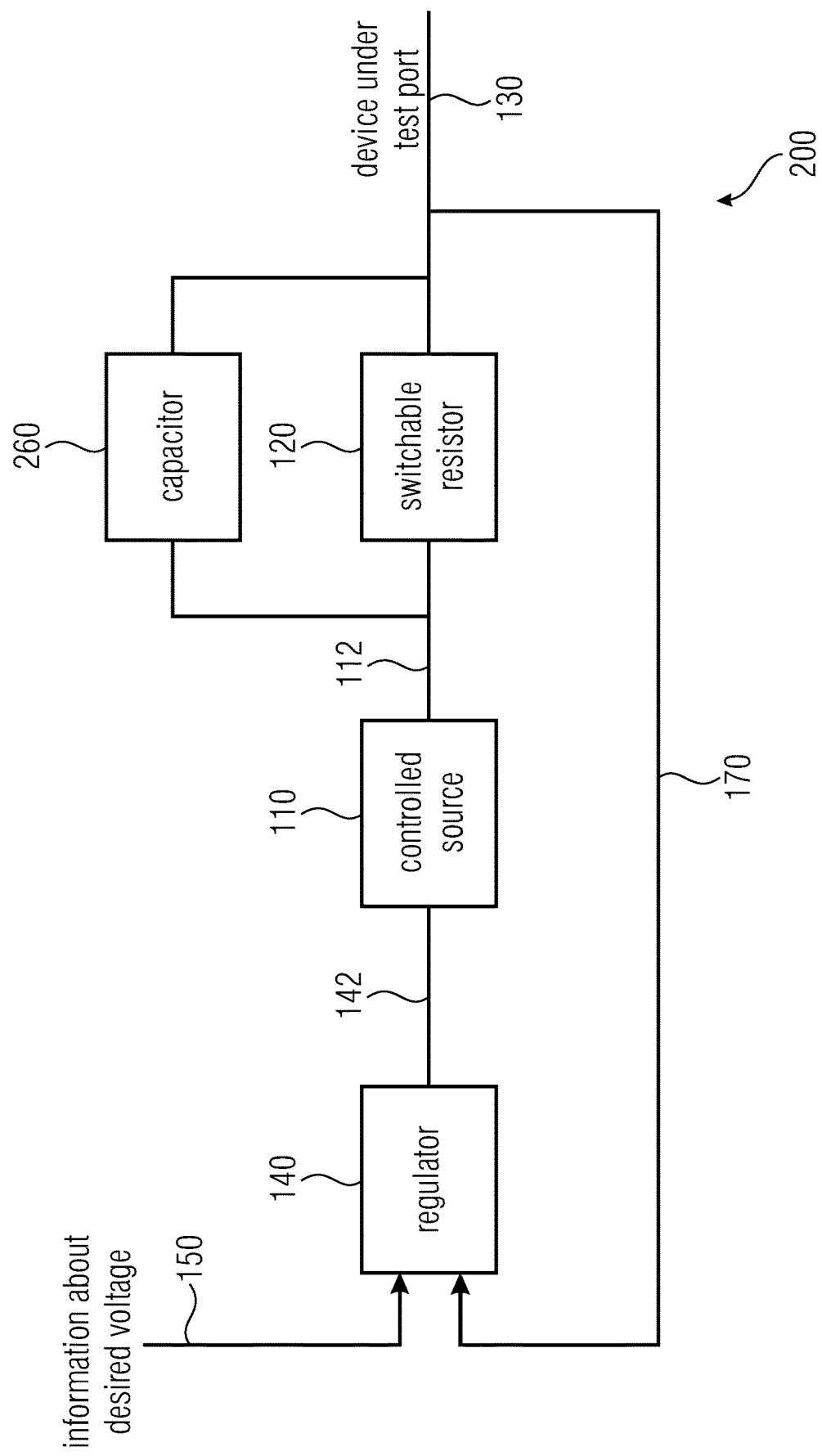
FIG. 2 shows a block diagram of an apparatus for providing a supply voltage to a device under test according to embodiments of the invention.

FIG. 2 shows a block diagram of an apparatus 200 for providing a supply voltage to a device under test according to embodiments of the invention. The apparatus 200 comprises a controlled source 110, a switchable resistor 120, a device under test port 130, a regulator 140 and a capacitor 260. The controlled source 110, the switchable resistor 120 and the regulator 140 are arranged in a control loop 170.

The apparatus 200 (like the apparatus 100) uses the control loop 170 to feedback a voltage at the device under test port 130 to the regulator 140. The regulator uses the control loop 170 and an information about a desired voltage to produce a control signal 142. The control signal 142 is provided to the controlled source 110 which provides an output voltage 112 via the switchable resistor 120 to the device under test port 130. The capacitor 260 is, at least during a switching of the switchable resistor 120, circuited in parallel to the switchable resistor 120. The output voltage 112 of the controlled source 110 is steered based on the control signal 142. For example, when the control loop 170 feeds back a voltage measurement deviating from a desired voltage at the device under test port 130 the regulator 140 provides the control signal 142 such that the deviation is minimized. Thereby, the control loop 170 enables a stable voltage at the device under test port 130 for stationary conditions. When the switchable resistor 120 changes its switch state, a non-stationary condition is observed and, thereby, a large change of a voltage drop across the switchable resistor 120 would take place if the capacitor 260 would not be circuited in parallel to the switchable resistor. When changing the switch state of the switchable resistor 120 the capacitor 260 slows a change of a voltage drop across the switchable resistor 120 such that a large change of the voltage drop is spread over time. Thus, a slow non-stationarity is observed which can be regulated by the regulator 140 based on the voltage measured at the device under test port 130.

The apparatus 200 effectively avoids a large deviation of the voltage at the device under test port 130 due to the capacitor 260 set in parallel to the switchable resistor when switching the switchable resistor 120. Thereby, the large change of voltage is spread over time such that the regulator has sufficient time to compensate it using the control loop such that the voltage at the device under test port 130 deviates only with ±5%.

Figure 3:
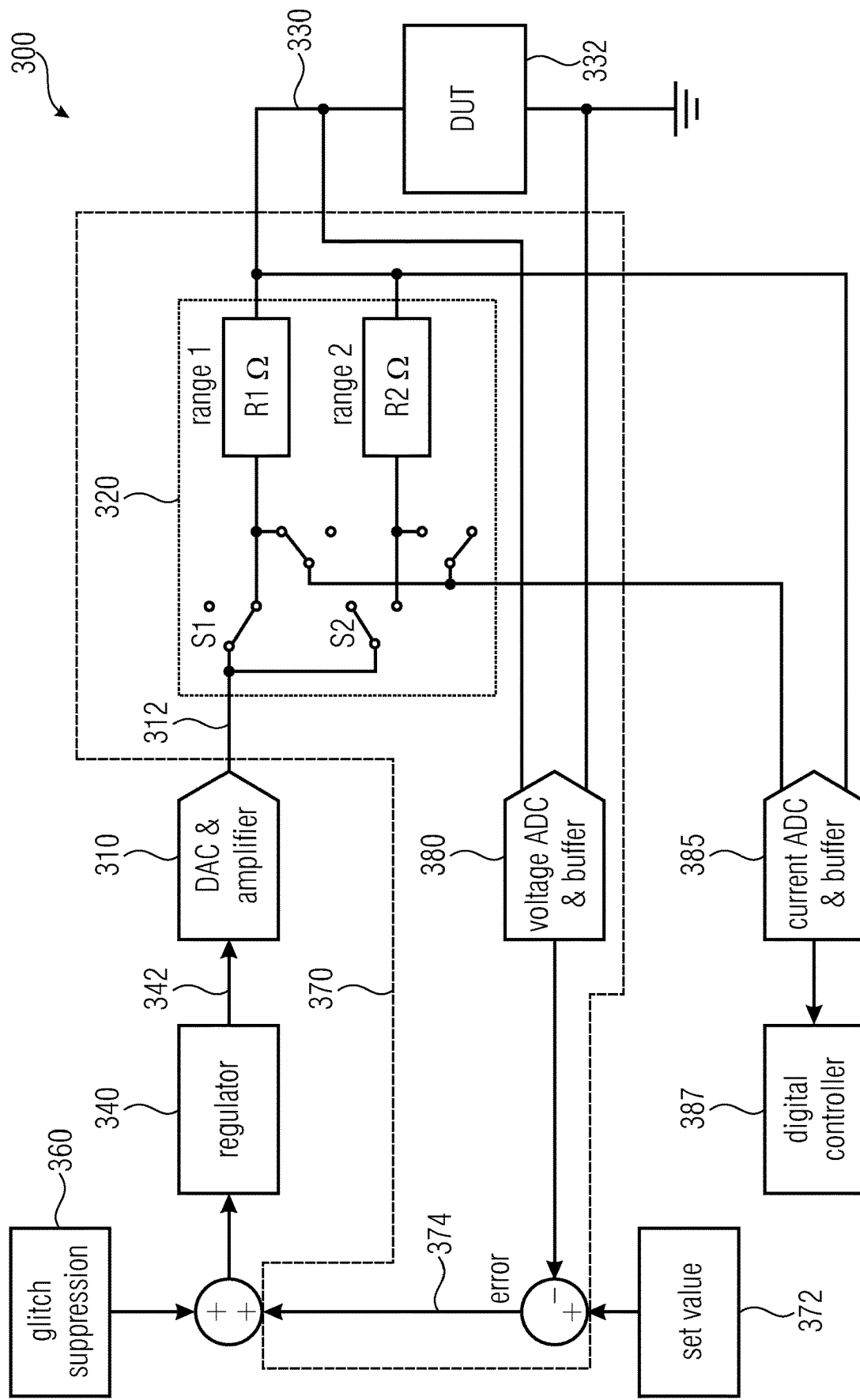
FIG. 3 shows a block diagram of an apparatus for providing a supply voltage to a device under test according to embodiments of the invention.

FIG. 3 shows a block diagram of an apparatus 300 for providing a supply voltage to a device under test according to embodiments of the invention. The apparatus 300 comprises a controlled source 310, a switchable resistor 320, a device under test port 330, a regulator 340 and a glitch suppression unit 360 configured to inject a compensation signal (e.g. compensation signal 160 in FIG. 1). The regulator 340, the controlled source 310, the switchable resistor 320 and the device under test port 330 are circuited in a control loop 370. Furthermore, the apparatus 300 comprises optionally a voltage analog to digital converter (ADC) and buffer 380 which is also circuited into the control loop 370, a current analog to digital converter (ADC) and buffer 385 and a digital controller 387. Moreover, connected to the control loop 370 a set value provider 372 is arranged. At the device under test port 330 a device under test 332 is connected to the apparatus 300.

The apparatus 300 is configured to provide a voltage at the device under test port 330 which corresponds to a desired voltage defined by a set value given by the set value provider 372.

Therefore, the voltage analog to digital converter 380 feeds back a measured voltage at the device under test port 330 which is subjected to a comparison with a set value in the control loop (e.g. the set value is subtracted from the measured voltage).

Based on this comparison an error signal is provided 374. The error signal 374 is provided to the regulator 340 which provides a control signal 342 based on the error signal. The control signal 342 is provided to the controlled source 310 which is implemented here as a digital to analog converter and amplifier in one unit, in other words a processing taking place between the voltage analog to digital converter 380 and the controlled source 310 is performed in the digital domain. Based on the control signal 342 the controlled source 310 provides an output voltage 312 via the switchable resistor 320 to the device under test port 330. The switchable resistor comprises a first switch S1 circuited in series with a first resistor R1 and a second switch S2 circuited in series with a second resistor R2. The switchable resistor 320 can in a first switch state only circuit resistor R1 between the controlled source 310 and the device under test port 330, in a second switch state circuit only resistor R2 between the controlled source 310 and the device under test port 330 and circuit R1 and R2 in parallel between the controlled source 310 and the device under test port 330 in an intermediate switch state. Based on the described switch states a varying current can be provided to the device under test 332. However, when changing between one switch state to another switch state, for example changing from the first switch state to the second switch state, wherein R1 is larger than R2, a smaller voltage drop across the switchable resistor occurs and therefore a larger portion of the output voltage 312 would be provided to the device under test port 330. Commonly, for testing a device under test a voltage of the device under test port 330 is supposed to be held constant. Therefore, the regulator provides a regulation of the device under test voltage which is, however, not fast enough to capture a fast change from one resistance value to another resistance value, therefore, leading to a so-called glitch at the device under test port 330 (i.e. deviation from a desired signal at the device under test port 330). The apparatus 300 comprises a glitch suppression unit 360 which anticipates a change of a voltage drop (e.g. by knowledge of switching times and resistance values of the switchable resistor 320) across the switchable resistor 320 and thereby injects a compensation signal to the error signal 374 which is provided to the regulator 340. The glitch suppression unit is able to provide an appropriate compensation signal which steers the controlled source 310 and compensates the change of the voltage drop across the switchable resistor 320 leading to a substantially constant voltage at the device under test port 330. Moreover, the apparatus 300 is configured to perform a current measurement of a current flowing into the device under test 332. The current measurement is performed based on a measured voltage across the switchable resistor 320 and a knowledge about resistance values of the switchable resistor. The current is acquired by current analog to digital converter and buffer 385 which, based on the measured voltage, obtaining the current value is passed to the digital controller 387 for further processing. The measured current values can be used to identify devices of the devices which are defective.

Figure 4:
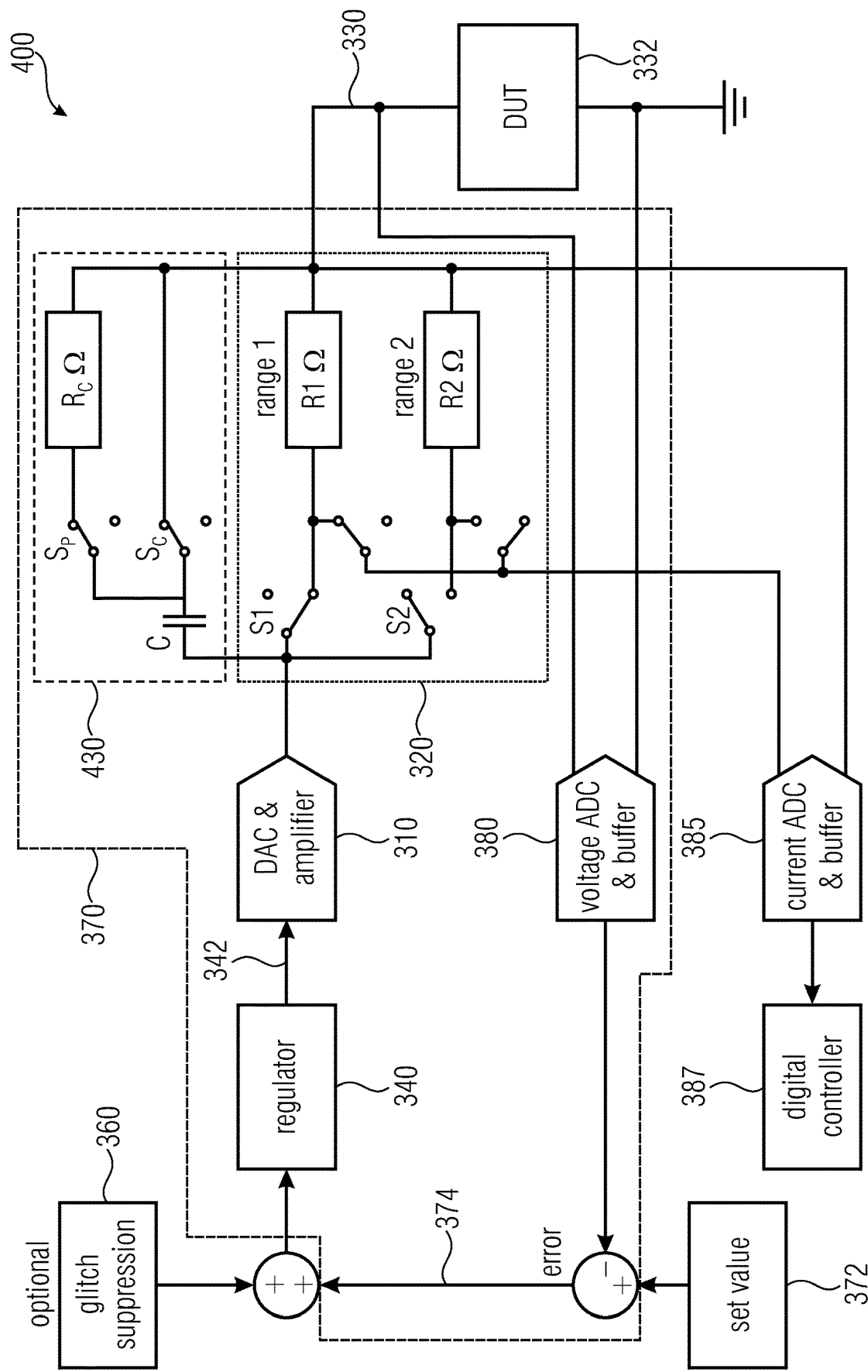
FIG. 4 shows a block diagram of an apparatus for providing a supply voltage to a device under test according to embodiments of the invention.

FIG. 4 shows an apparatus 400 for providing a supply voltage to a device under test according to embodiments of the invention. The apparatus 400 comprises the same features and functionalities as apparatus 300 but is enhanced with a capacitor arrangement 490 configured similarly to capacitor 260 of apparatus 200. The capacitor arrangement 490 is circuited in parallel to the switchable resistor 320 and comprises a capacitor C, a first switch $S_C$ and a second switch $S_P$, wherein the first switch is configured to couple the capacitor C in parallel to the switchable resistor via an electrical path with low resistance and the second switch $S_P$ is configured to couple the capacitor C in parallel to the switchable resistor 320 via an electrical path having a large resistance. For the large resistance, the capacitor arrangement 490 comprises a pre-charge capacitor $R_C$ circuited in series with the second switch $S_P$. When switching the switchable resistor 320 the first switch $S_C$ of the capacitor arrangement 490 will be closed and the second switch $S_P$ will be open. Thereby, a voltage change across the switchable resistor is reduced and slowed as the capacitor acts as a voltage buffer. However, when the switchable resistor 320 is in a stationary state, i.e., only one of the resistors R1 or R2 are circuited between the controlled source 310 and the device under test port 330 and a current measurement is performed, an influence of the capacitor C on the current measurement needs to be avoided to enable fast current measurements. Therefore, the capacitor C will be coupled through the resistor $R_C$ to the switchable resistor 320 in a stationary state of the switchable resistor 320, i.e., the first switch $S_C$ will be open and the second switch $S_P$ will be closed, such that only a small current is flowing through the capacitor if at all. Moreover, using the capacitor arrangement 490 the apparatus 400 is able to compensate a change of a voltage drop across the switchable resistor 320 either based on the conventional regulation as the change of the voltage drop is slowed or in combination with the glitch suppression 360. Thereby, a voltage at the device under test port can be held constant within ±10% when changing a switch state of the switchable resistor 320. Further, the capacitor arrangement 490 may be configured to decouple the capacitor C when performing current measurements across the switchable resistor 320 (e.g., by opening the first switch $S_C$ and the second switch $S_P$).

Figure 5:
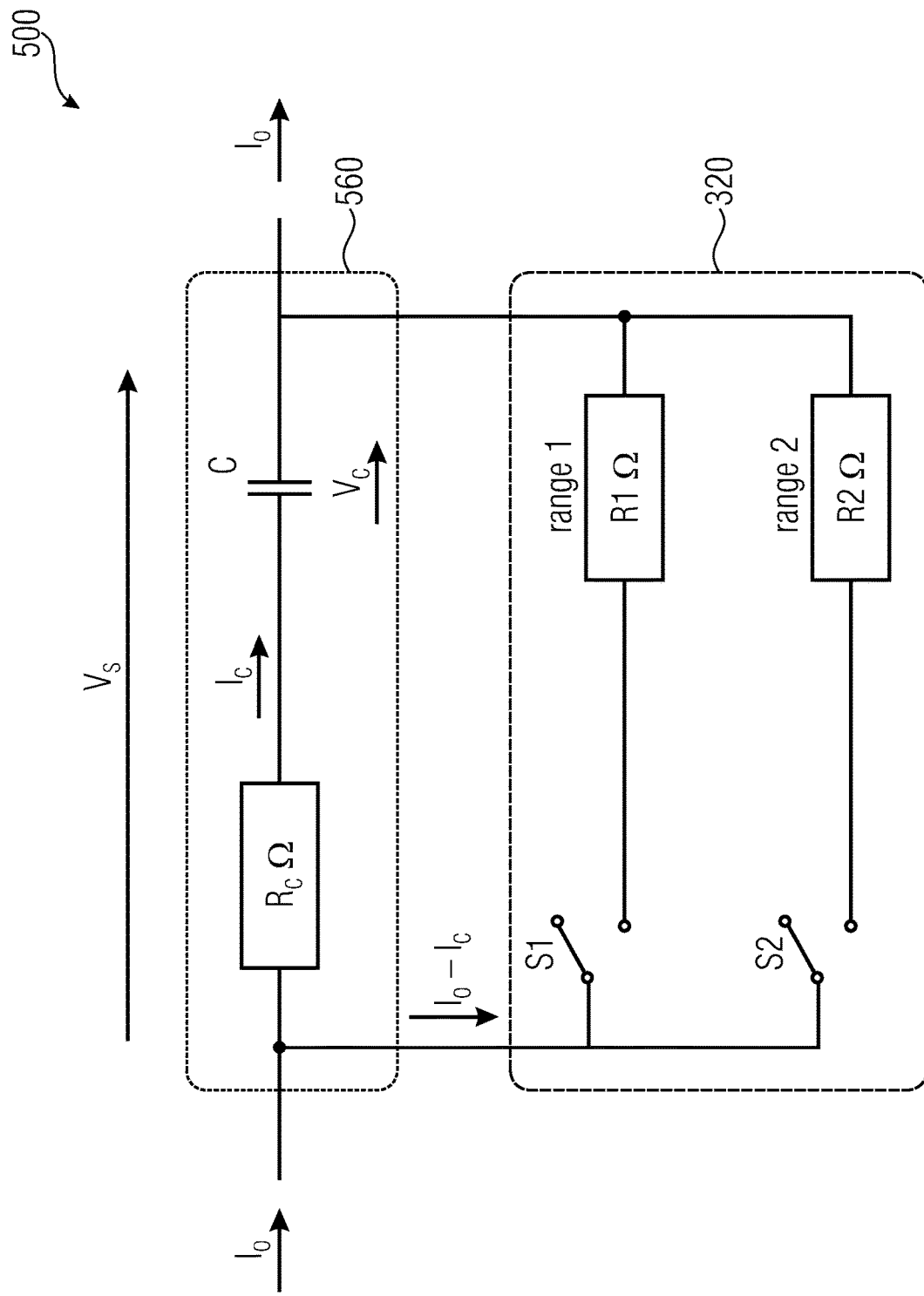
FIG. 5 shows a schematic of a circuit according to embodiments of the invention.

FIG. 5 shows a circuit 500 according to embodiments of the invention comprising a switchable resistor 320 and a capacitor arrangement 560 circuited in parallel to the switchable resistor 320. A current $I_0$ is flowing into the circuit 500 and, due to Kirchhoff's current law, exits the circuit 500. In the circuit 500 the current $I_0$ is split into a current $I_C$ flowing through the capacitor arrangement 560 and a current $I_0-I_C$ flowing through the switchable resistor 320 (the switchable resistor is shown with both switches S1 and S2 open in an intermediate switch state having an infinite resistance). Across the parallel arrangement of the capacitor arrangement 560 and the switchable resistor 320 a voltage drop $V_S$ is observed which can be sub-divided in the capacitor arrangement into a voltage drop across the capacitor $V_C$ and a voltage drop $V_R$ (not shown) across a resistor RC circuited in series with the capacitor C. The circuit 500 will be used in the following description to illustrate embodiments of the invention.

Figure 6:
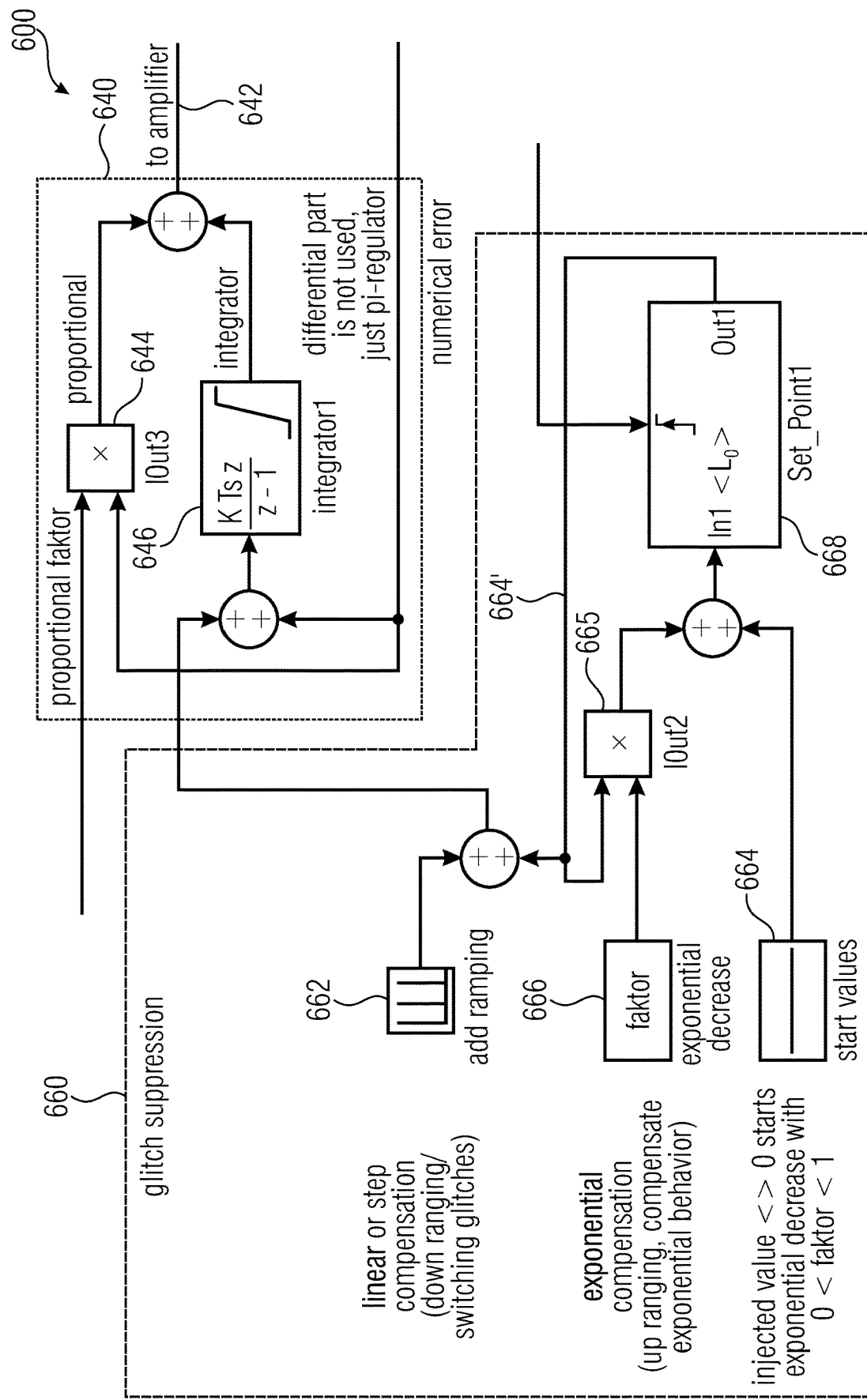
FIG. 6 shows a block diagram of a regulator and a glitch suppression unit according to embodiments of the invention.

FIG. 6 shows a block diagram 600 of a regulator 640 and a glitch suppression unit 660 according to embodiments of the invention. The glitch suppression unit 660 may, for example, be the glitch suppression unit 360 and the regulator 640 may, for example, correspond to the regulator 140 or 340. The regulator 640 is a PI regulator, i.e., using a proportional unit 644 and an integrating unit 646 for producing a control signal 642. The glitch suppression unit 660 comprises an add ramping unit 662 configured to produce a linear or step compensation signal when switching from a switch state with a high resistance to a switch state with a small resistance (e.g., intermediate switch state). Moreover, the glitch suppression unit 660 comprises a start value provider 664 for providing a start value of an exponential signal and exponential decrease factor provider 666 configured to adjust a decay speed of an exponential signal component and a clocked latch unit 668. The glitch suppression unit 660 is configured to coordinate produced signals of the glitch suppression unit 660 with switch times of a switchable resistor. The exponential decrease factor 666 (providing a value larger than 0 and smaller than 1) is multiplied in each iteration (e.g. for each cycle of the clocked latch unit 668) to the current value of the exponential signal in the multiplier 665 leading to a decreasing signal facilitated by the feedback loop 664'. The linear or step compensation signal 662 is added on the exponential signal component with a timing coordinated with the switch time and fed to the regulator 640. In a different switching mode only the add ramping unit 662 may provide a contribution to the glitch suppression which feeds a signal of rectangular shape to the integrating unit 646 of the regulator in order to suppress a glitch when switching from a low resistance state to a high resistance state of the switchable resistor.

Figure 7:
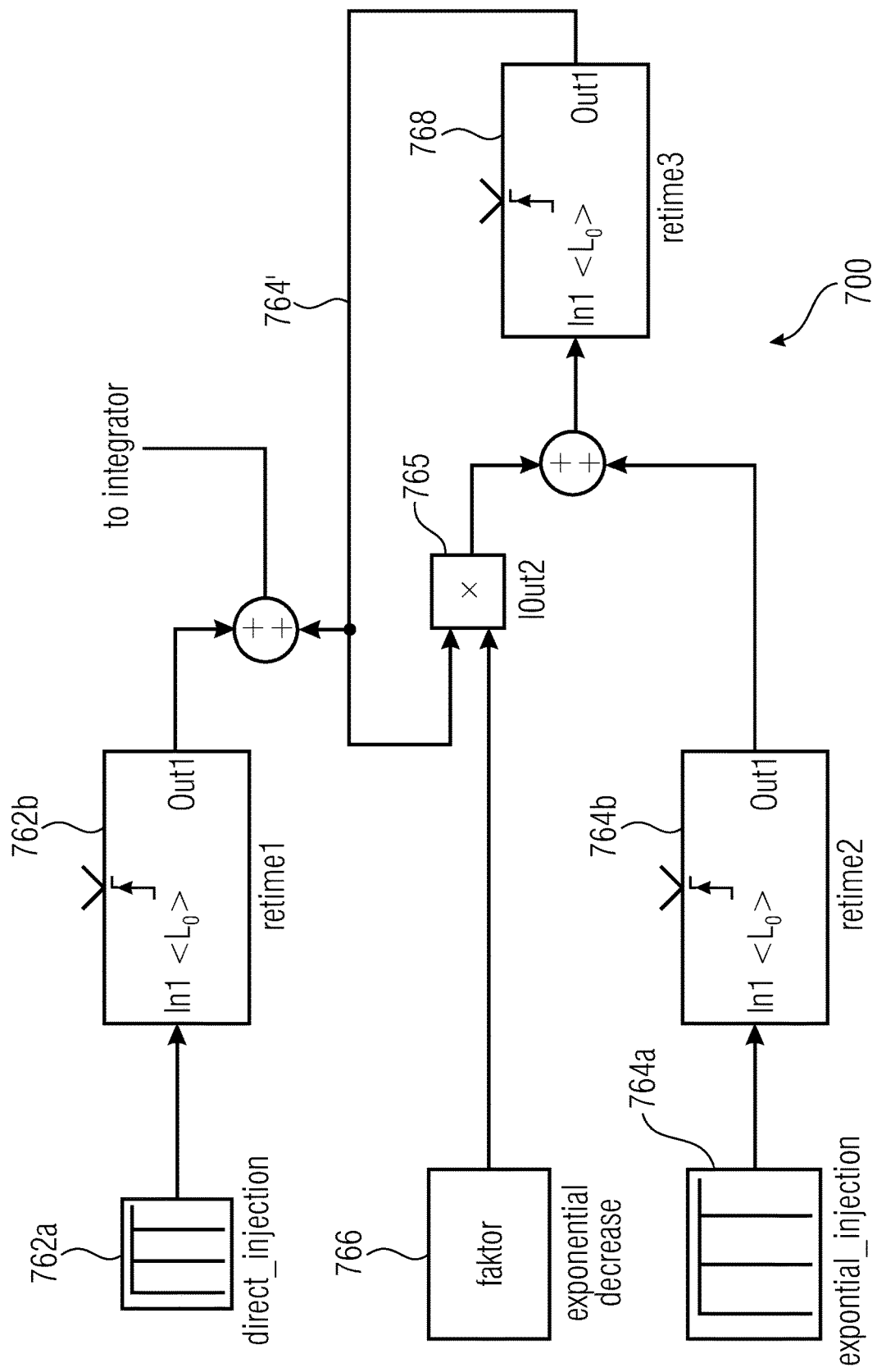
FIG. 7 shows a block diagram of a part of a glitch suppression unit according to embodiments of the invention.

FIG. 7 shows a block diagram 700 of a glitch suppression unit (e.g. glitch suppression unit 660) (or a part thereof) according to embodiments of the invention. For example, to produce a compensation signal for up-ranging, i.e., switching from a high resistance state to a low resistance state of the switchable resistor. The block diagram 700 comprises a direct injection unit 762a and a direct injection trigger unit 762b (for example, a latch) which correspond to the add ramping unit 662 of regulator 660, wherein the direct injection trigger unit 762b triggers the direction injection of a linear or an exponential signal component. An exponential signal component can be produced in the lower part of the block diagram 700 with the exponential injection unit 764a and the exponential injection trigger 764b which correspond to the start value provider 664 of glitch suppression unit 660. The exponential injection unit 764a is controlled in time by the trigger unit 764b such that it can be synchronized with the switch times of the switchable resistor. Moreover, the block diagram 700 comprises an exponential decrease factor provider 766 similar to the exponential decrease factor provider 666 which provides a value between 0 and 1 to the feedback loop 764' similar to the feedback loop 664'. Thereby, the start value of the exponential injection unit 764a is reduced by recursion through multiplication with a value smaller than 1. The exponential decay signal is tapped directly from the feedback loop 764' and added to a signal provided by the direction injection unit 762a which may provide for an overshoot accounting for a large resistance change of the switchable resistor. The resulting signal is then fed to the integrating unit of a regulator.

Figure 8:
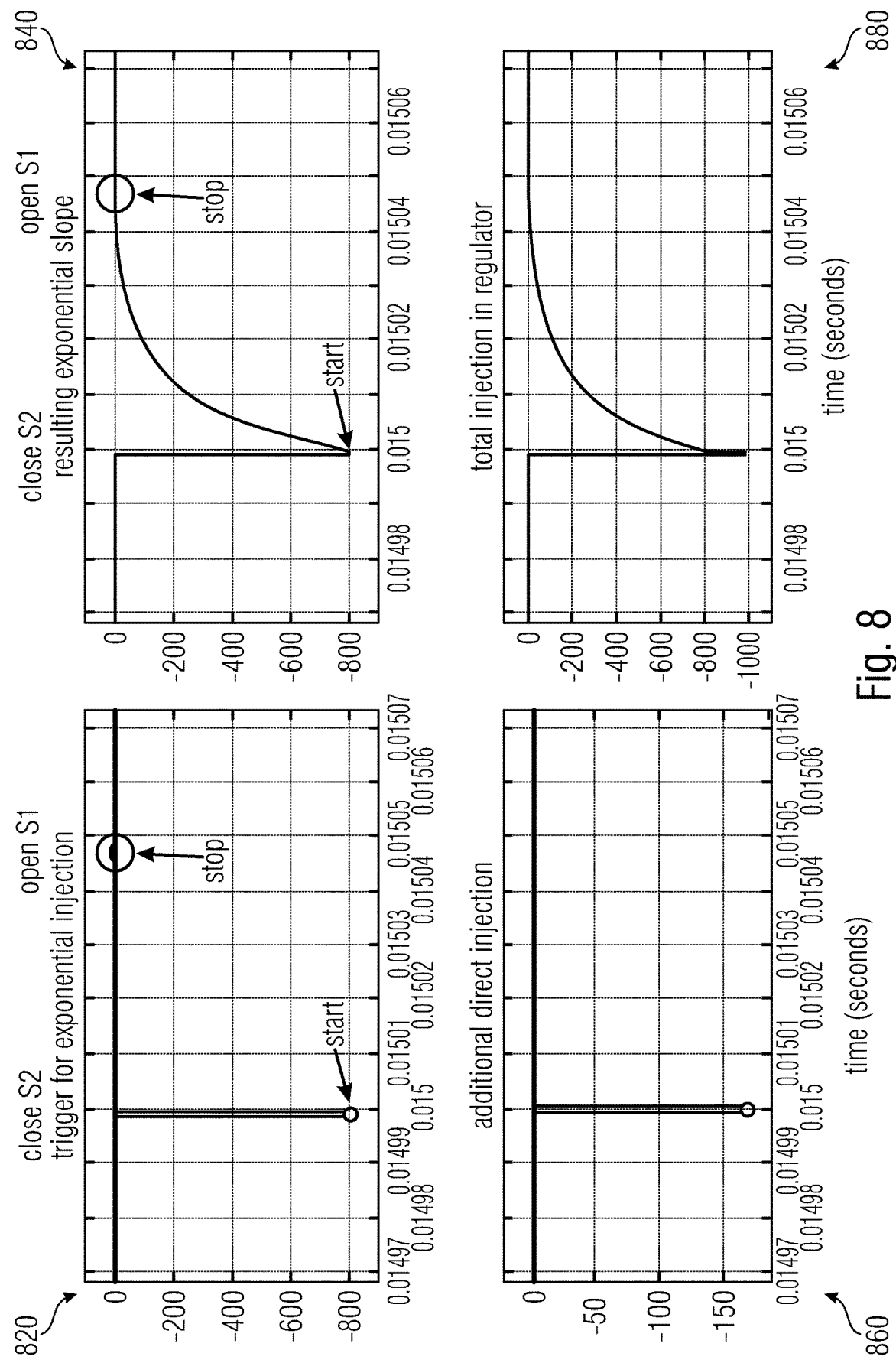
FIG. 8 shows a graphical representation of signals in graphs according to embodiments of the invention.

FIG. 8 shows graphs 820, 840, 860 and 880 illustrating the design of a compensation signal when switching the switchable resistor from a high resistance value to a small resistance value via an intermediate switch state having a smaller resistance than the smallest resistance value. Graph 820 shows values provided by either a start value provider 664 or exponential injection provider 764a when the switchable resistor is in the first switch state, i.e., S1 is closed and S2 is open, and transitioning to the second switch state, i.e., S1 is open and S2 is closed. When transitioning from the first switch state to the second switch state an intermediate switch state is effective. Therefore, the signal provided has a first large negative peak indicated by "Start" which is injected when S2 is closed, i.e., an intermediate state is entered wherein S1 and S2 are simultaneously closed. After several time units, e.g., microseconds, a small positive signal is injected indicated with "Stop" when S1 is opened and the second switch state is effective. Through recursion over the feedback line 664' or 764' an exponential slope is obtained starting with a time instance when S2 is closed which is shown graph 840. Moreover, in graph 860 an additional direct injection provided by the add ramping unit 662 or the direct injection unit 762a and 762b is shown. The direct injection is aimed at countering a large voltage drop due to switching from the first switch state to an intermediate switch state, wherein the first switch state has a high resistance and the intermediate switch state has a small resistance. Therefore, a total compensation signal is depicted in graph 880 as a result from adding the signal of the graph 840 and the signal of the graph 860. The resulting signal depicted in graph 880 has an overshoot at the beginning, i.e., when the second switch is closed and further comprises an exponential decaying component for compensating a discharging of a parallel connected capacitor.

Figure 9:
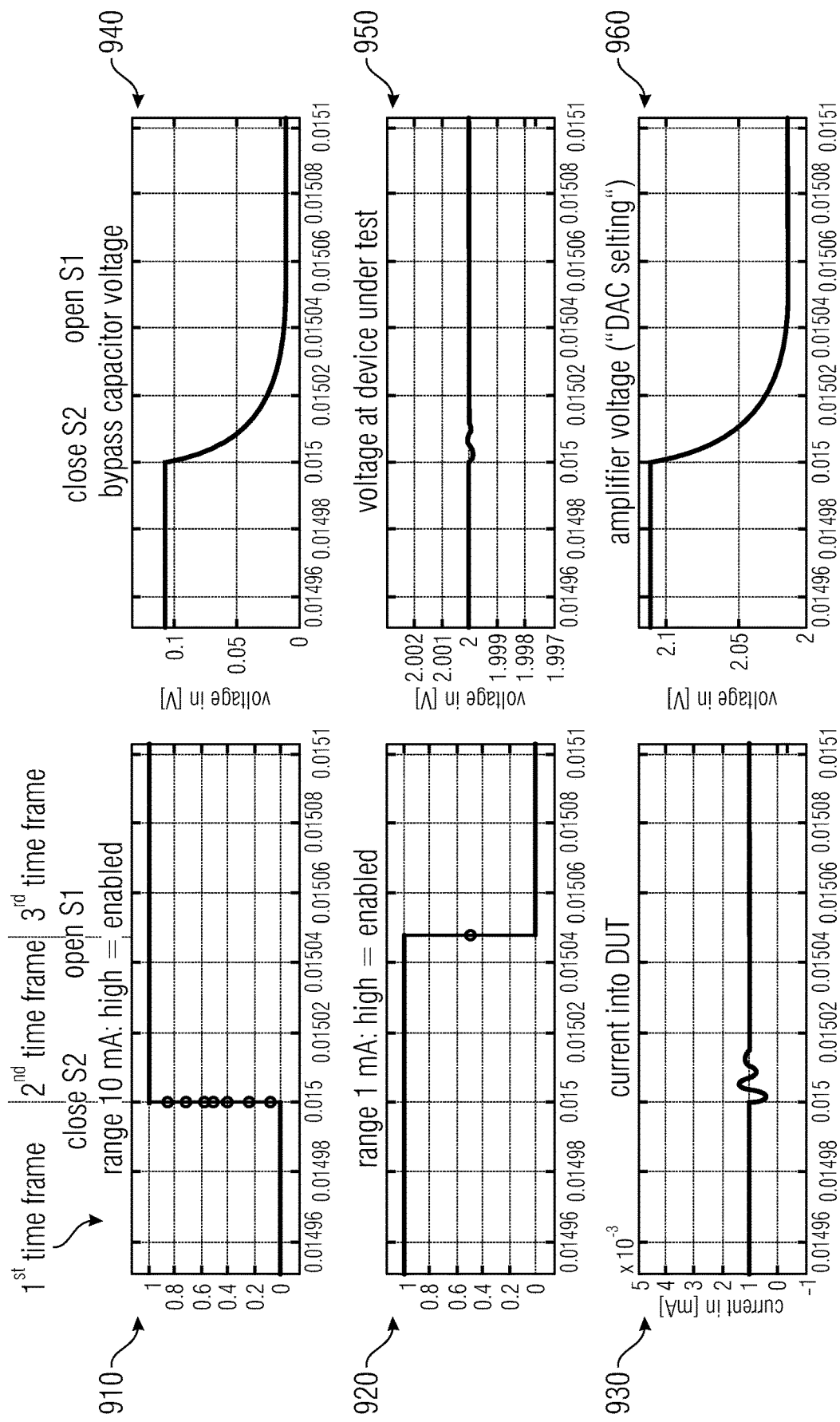
FIG. 9 shows a graphical representation of signals in graphs according to embodiments of the invention.

FIG. 9 shows graphs 910, 920, 930, 940, 950 and 960 illustrating a behavior of an embodiment according to the invention when switching from the first switch state to the second switch state using e.g. the injection signal from graph 880. Graphs 910 and 920 show enabled current ranges, wherein a high value indicates where the corresponding current range is enabled. For example, a range of 10 mA is associated with resistor R2, e.g., from circuit 500, indicated in graph 910. Further, graph 920 is associated with a range 1 mA which is associated, for example, with resistor R1, e.g., of circuit 500. Graphs 910 and 920 show that in a first time frame only one current range is active, i.e., only one resistor is circuited between the controlled source and the device under test port, in a second time frame two resistors, e.g., resistor R1 and R2, are circuited in parallel between the controlled source and the device under test port and in a third time frame only a small resistance value, e.g., resistor R2, is circuited between the controlled source and the device under test port. Graph 930 shows a current which flows from the first to the third time frame into the device under test via the switchable resistor. A small deviation of the current is observable when switching from the first switch state to the second switch state, i.e., from the first time frame to the second time frame. Graph 940 shows a voltage across a bypass capacitor, e.g., capacitor 260 or capacitor arrangement 490 and 560. In the first time frame the voltage across the capacitor is high due to a high resistance in the first switch state circuited in parallel to the capacitor. In the second time frame the intermediate switch state is active and only a small resistance is circuited in parallel to the capacitor leading to a discharge of the capacitor until it reaches a voltage corresponding to a voltage drop over a small resistance in the third time frame, i.e., second switch state. Graph 950 shows a voltage at the device under test port which is constant at about 2 V in the first and third time frame but glitches with less than 1 mV in the second time frame when switching from the first switch state to the intermediate switch state. The described voltage evolution achieves a substantially constant voltage at the device under test even when switching of measurement ranges, i.e., the switchable resistor, which is a desired behavior for testing. Moreover, in graph 960 a voltage at an amplifier, i.e., a controlled source, is depicted. The voltage in graph 960 follows a voltage drop at the bypass capacitor shown in graph 940, thereby, a reduced voltage drop of the bypass capacitor is compensated with a reduced voltage provided at the output of the controlled source.

Figure 10:
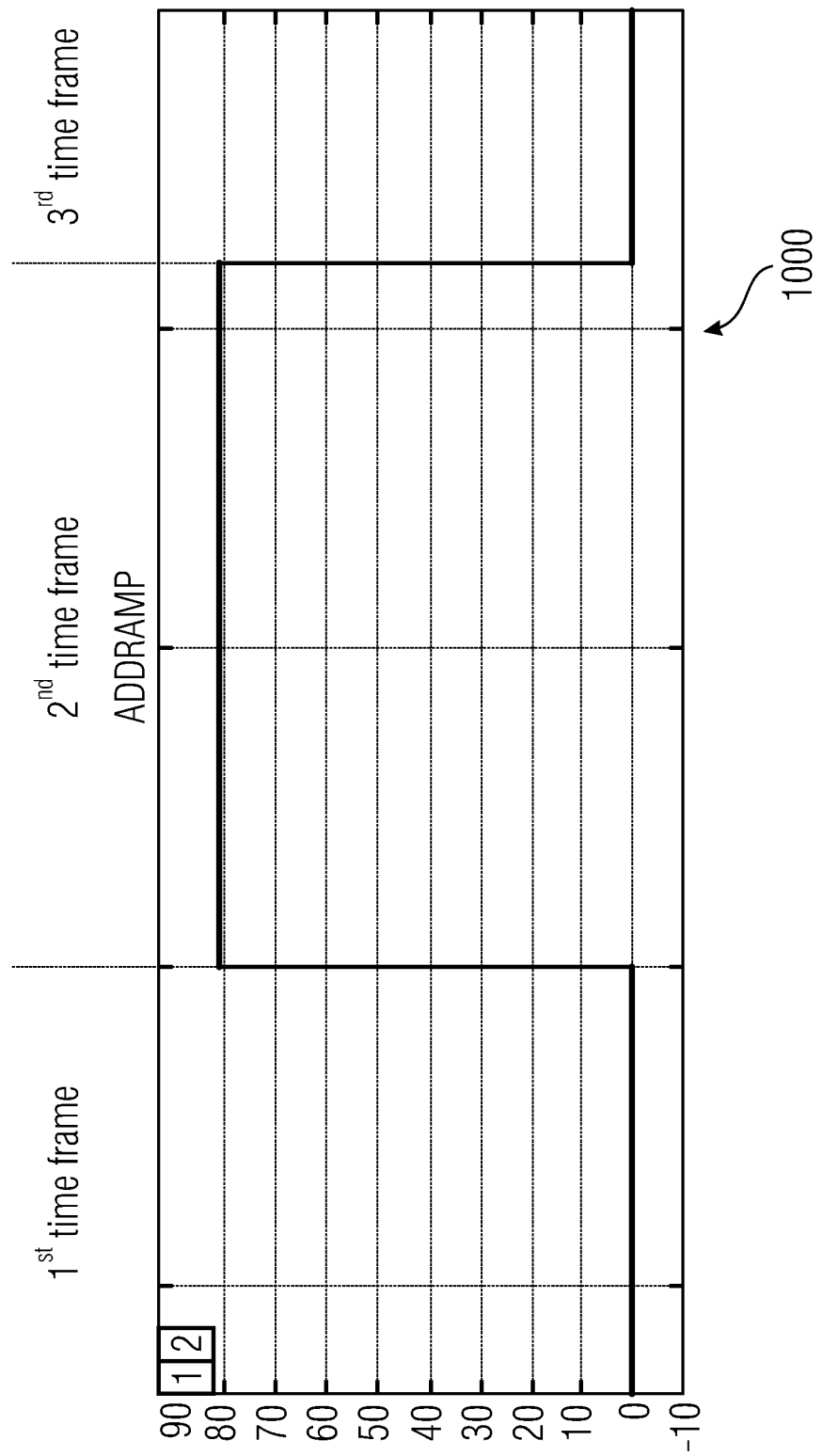
FIG. 10 shows a graph of a compensation signal according to embodiments of the invention.

FIG. 10 shows a graph 1000 of a compensation signal according to embodiments of the invention provided to the integrating unit of a regulator. The compensation signal in the graph 100 is of rectangular shape and is, therefore, zero in a first time frame and has a value different from zero in a second time frame and is again zero in a third time frame. Integrating the described rectangular shape leads to a signal component of the control signal with a linear slope. The described signal shown in graph 1000 may be provided by the add ramping unit 669 of glitch suppression unit 660 or by the add ramping unit 662 of glitch suppression unit 660.

Figure 11:
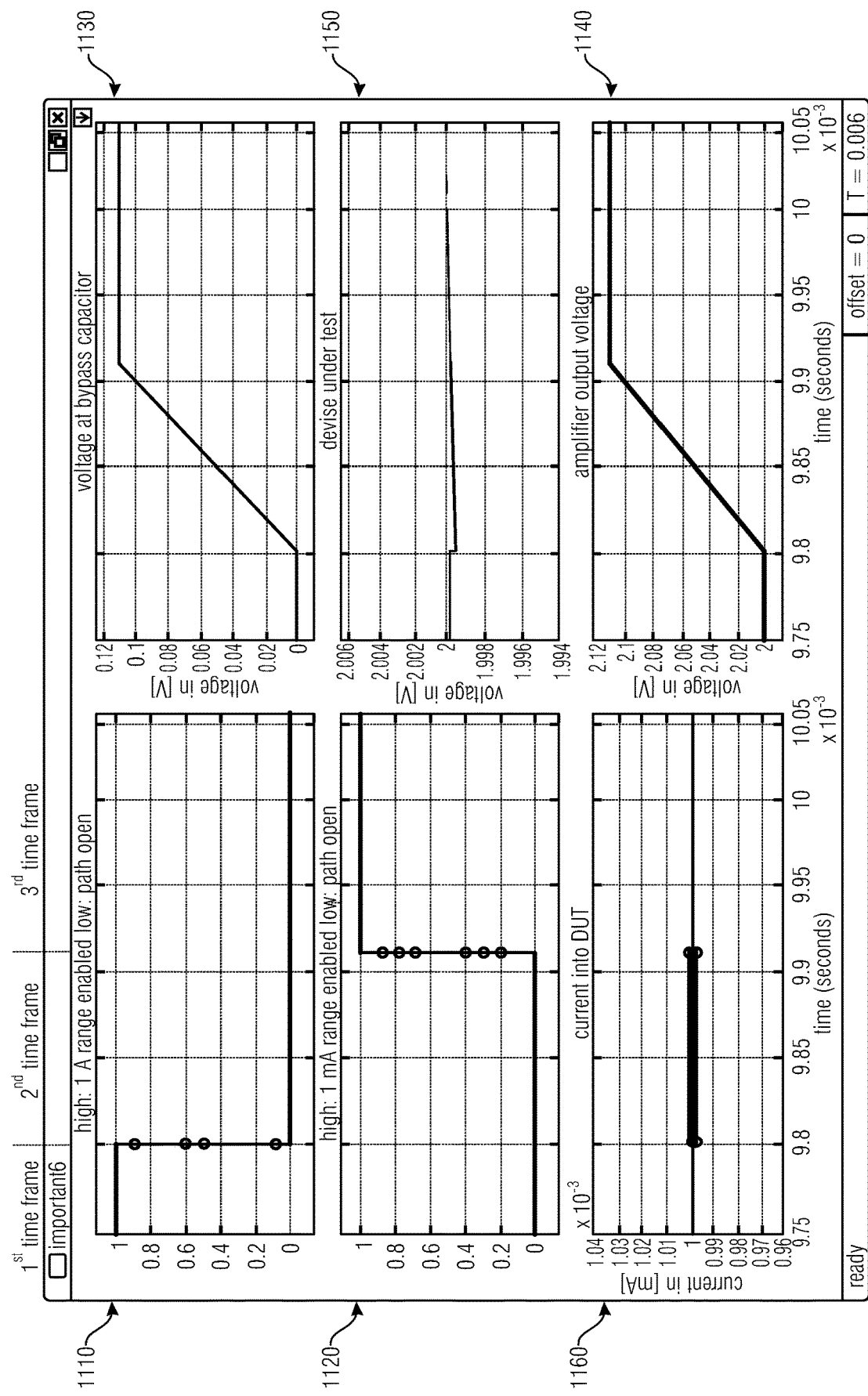
FIG. 11 shows a graphical representation of signals in graphs according to embodiments of the invention.

In FIG. 11 graphs 1110, 1120, 1130, 1140, 1150 and 1160 are shown describing signals when switching from the first switch state to the second switch state, i.e., from a state with a low resistance effective in the switchable resistor to a state with a high resistance effective in the switchable resistor. The behavior described in FIG. 11 may be obtained by application of an injection signal according to graph 1000 to an integrating portion of a the regulator. The effective states are shown in 1110 and 1120. Graph 1110 shows that for the first time frame a state is active in which a current of 1 ampere can be measured corresponding to a small resistance between the controlled source and the device under test port. In graph 1120, which is active from the third time frame on, a 1 mA range is active corresponding to a high resistance between the controlled source and the device under test port. In between the first time frame and the third time frame a second time frame is arranged in which neither the 1 A range nor the 1 mA range is active. This can, for example, be facilitated by having switch 1 closed and switch 2 open of circuit 500 in the first time frame and having both, switch 1 and 2, open in the second time frame and having switch 1 open and switch 2 closed in the third time frame. In the second time frame where an infinite resistance is effective in the switchable resistor all current of the controlled source is used to load the capacitor coupled in parallel shown with graph 1130. The charging is performed with a linear voltage increase provided by the controlled source shown in graph 1140 in the second time frame. Voltage at the capacitor is charged until a voltage is reached according to a voltage drop of the first switch state, i.e., of a high resistance coupled in parallel to the capacitor. Graphs 1150 and 1160 show voltage and current into the device under test, respectively, wherein it is visible that the voltage shown in graph 1150 deviates only with about 1 mV and, therefore, can be said to be glitch-free, i.e. substantially constant.

Figure 12:
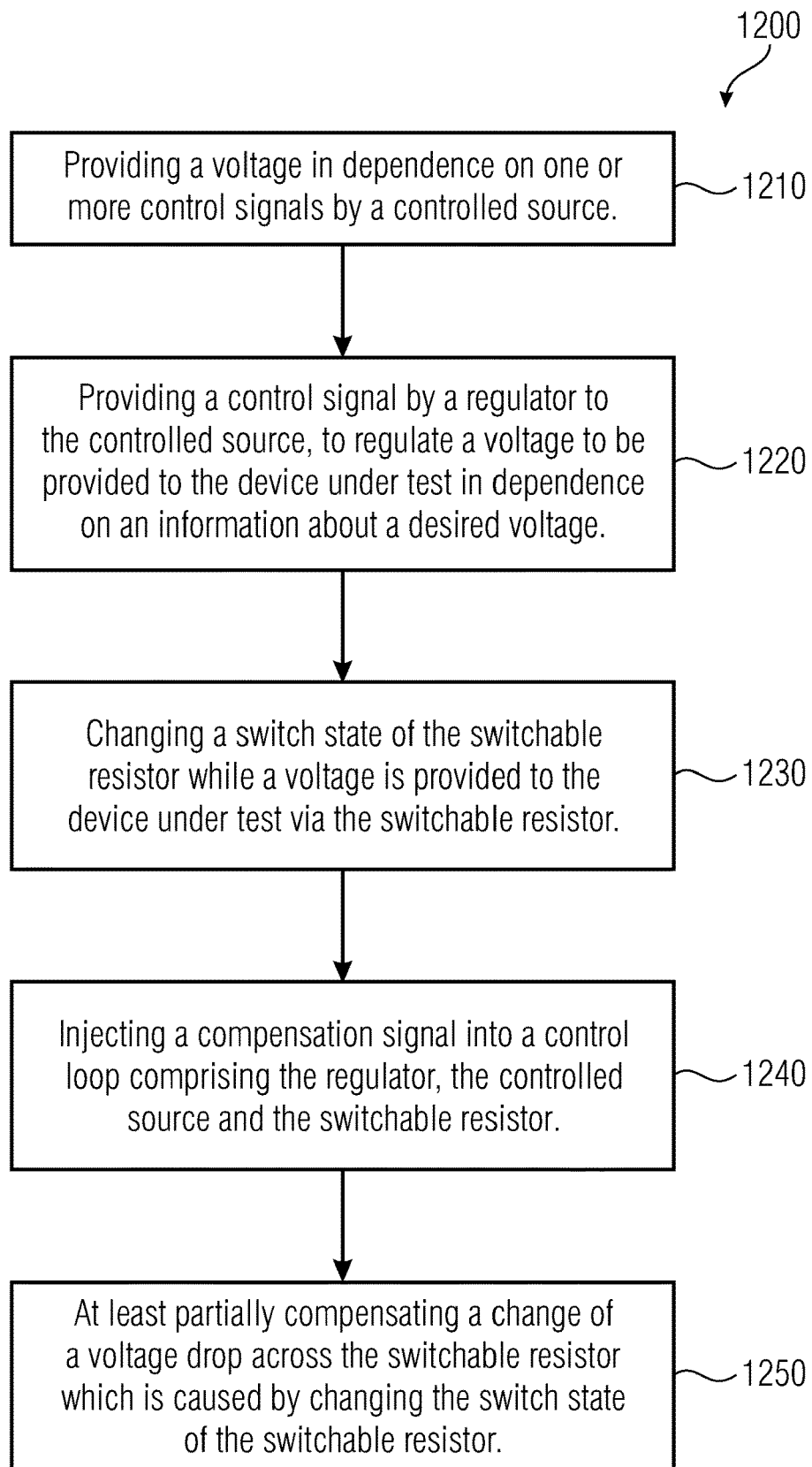
FIG. 12 shows a flow chart of a method according to embodiments of the invention.

FIG. 12 illustrates a flow chart of a method 1200 for providing a supply voltage to a device under test according to embodiments of the invention. The method comprises providing 1210 a voltage in dependence on one or more control signals by a controlled source, wherein a switchable resistor is circuited between the output of the controlled source and a device under test port, having a first resistance in a first switch state and a second resistance in a second switch state, wherein the second resistance is smaller than the first resistance. Further, the method comprises providing 1220 a control signal by a regulator to the controlled source, to regulate a voltage to be provided to the device under test in dependence on an information about a desired voltage. Moreover, the method comprises changing 1230 a switch state of the switchable resistor while a voltage is provided to the device under test via the switchable resistor. Furthermore, the method comprises injecting 1240 a compensation signal into a control loop comprising the regulator, the controlled source and the switchable resistor, to thereby cause a voltage change of the voltage provided by the controlled source. Further, the method comprises at least partially compensating 1250 a change of a voltage drop across the switchable resistor which is caused by changing the switch state of the switchable resistor.

Figure 13:
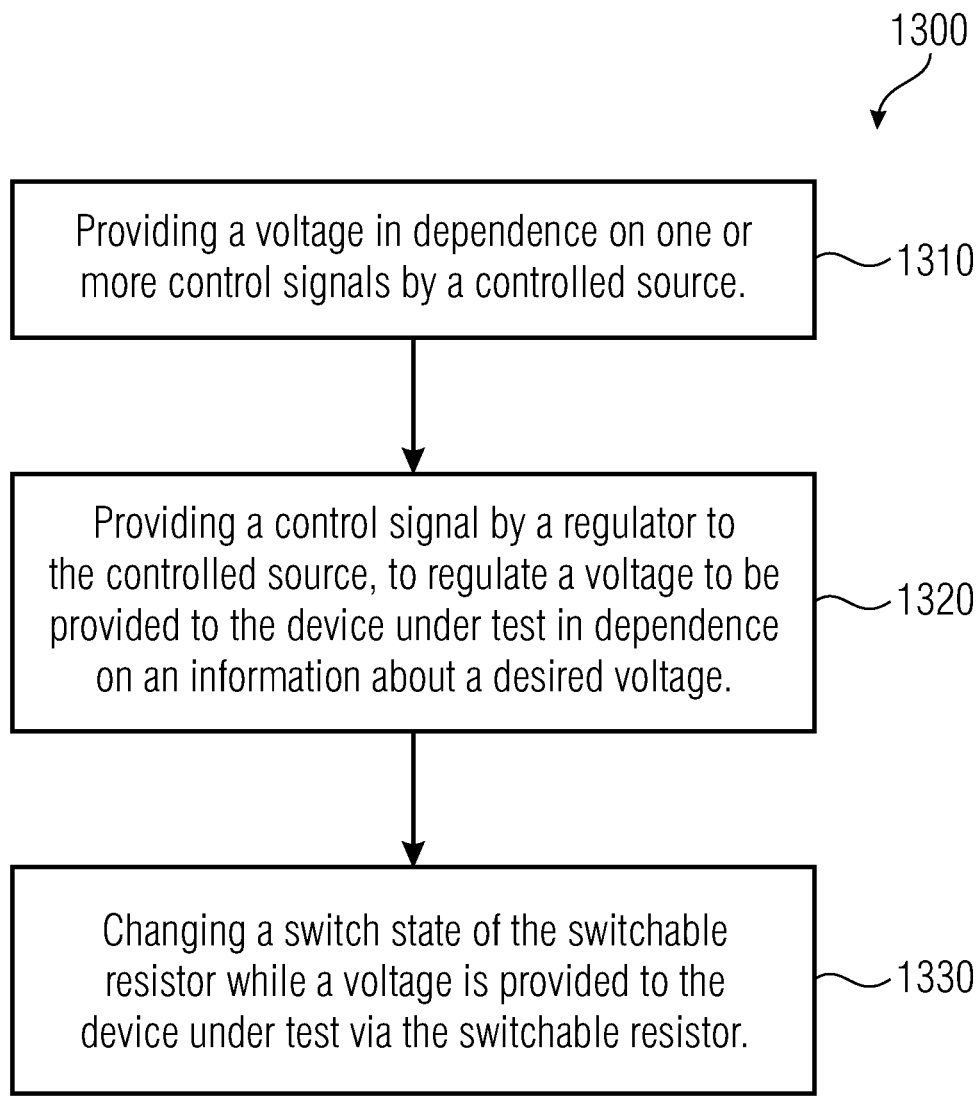
FIG. 13 shows a flow chart of a method according to embodiments of the invention.

FIG. 13 illustrates a flow chart of a method 1300 for providing a supply voltage to a device under test according to embodiments of the invention. The method 1300 comprises providing 1310 a voltage in dependence on one or more control signals by a controlled source, wherein a switchable resistor circuited between the output of the controlled source and a device under test port, having a first resistance in a first switch state and a second resistance in a second switch state, wherein the second resistance is smaller than the first resistance. Further, the method 1300 comprises providing 1320 a control signal by a regulator to the controlled source, to regulate a voltage to be provided to the device under test in dependence on an information about a desired voltage, wherein a capacitor is circuited in parallel to the switchable resistor at least during switching of the switchable resistor and configured to slow a voltage change across the switchable resistor which is caused by changing a switch state of the switchable resistor. Moreover, the method 1300 comprises changing 1330 a switch state of the switchable resistor while a voltage is provided to the device under test via the switchable resistor.

Further Aspects

In the following aspects of embodiments of the invention are described which can be used by themselves or in combination with any of the embodiments described herein. In other words, the embodiments described herein can be supplemented by any of the features and functionalities described in the following, either individually or in combination.

Figure 14:
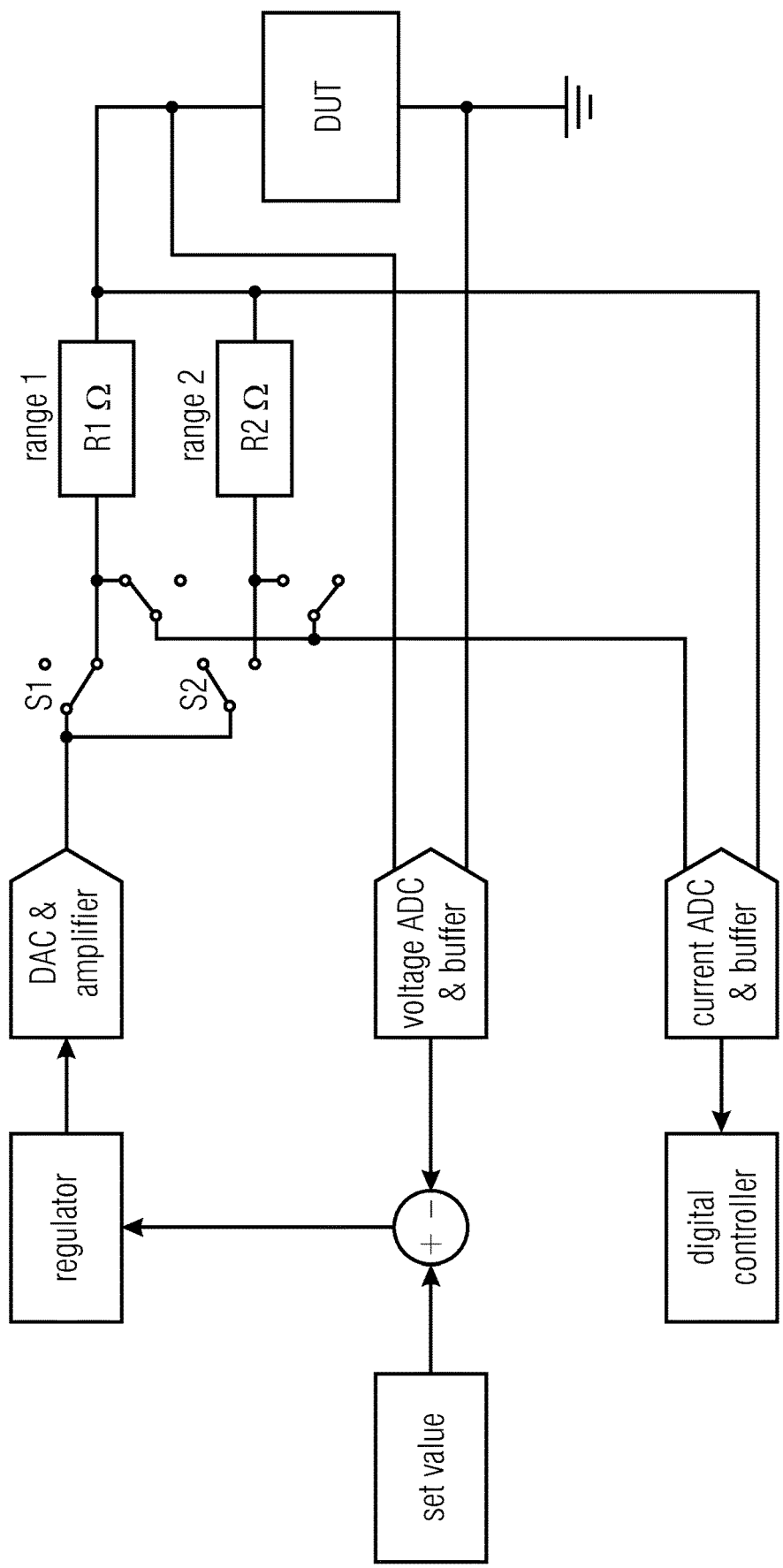
FIG. 14 shows a block diagram of a conventional power supply for a device under test.

Aspects of the invention describe a digital loop to the output or device under test (DUT) voltage. In FIG. 14 a simplified block diagram with two current measurement ranges is shown. A problem which has been identified is, how to switch from Range 1 to Range 2 without generation of a voltage glitch at the DUT.

Figure 15:
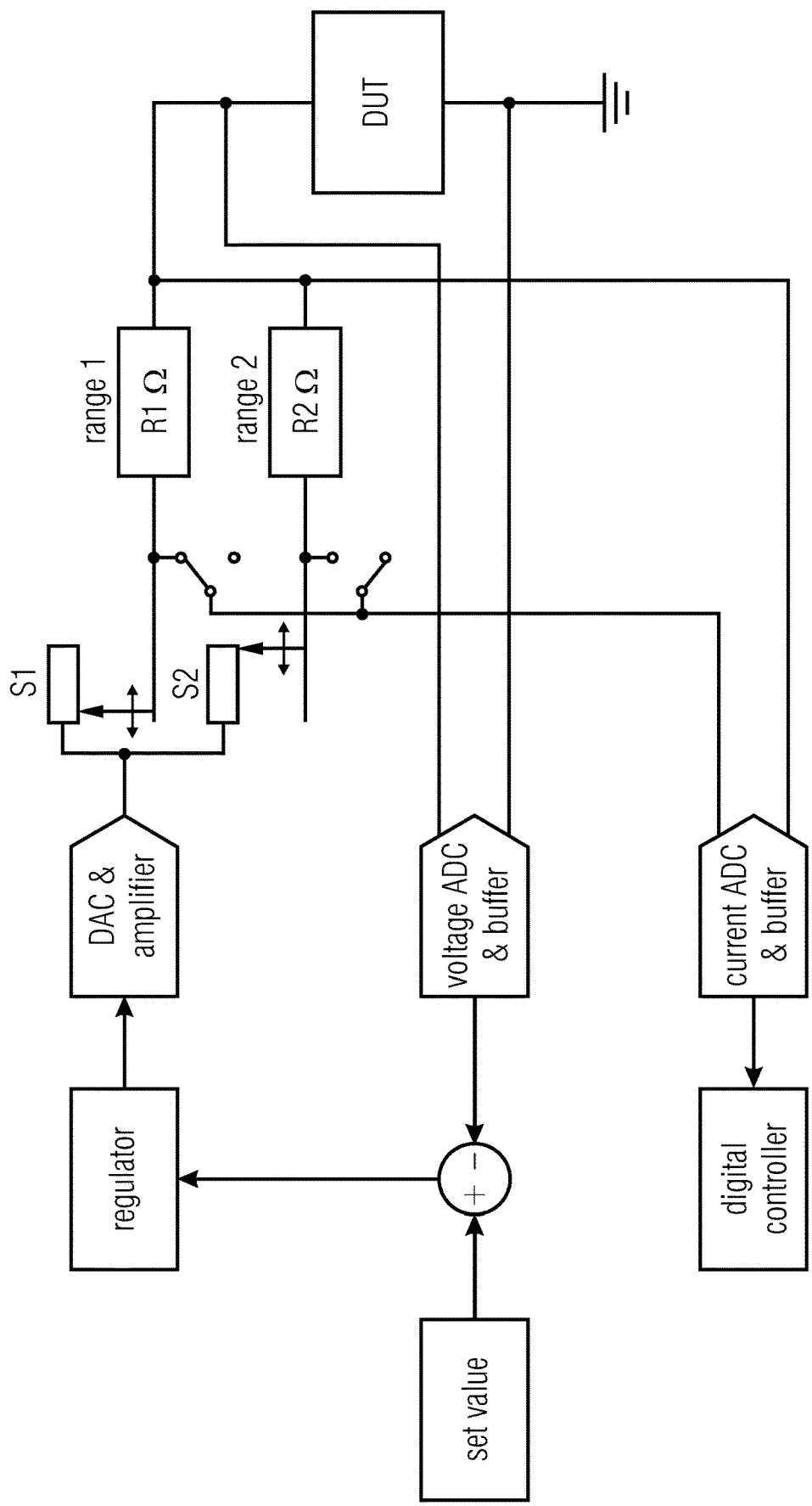
FIG. 15 shows a block diagram of a conventional power supply for a device under test.

In a conventional concept shown in FIG. 15 switches are operated in a "Make before Break" order. The switches are built to work "slow", it means, that they do not operate instantaneously, their change of resistance is "slow", e.g. using potentiometers.

It has been found that if changes in the loop are slow enough, the loop can follow the voltage change at the resistors. Moreover, it has been found that the loop has to be faster than a glitch. Further, it has been found that a complete cancellation is difficult as full control over switch resistance is difficult.

In conventional approaches, to change current measurements resistors (shunts) in a power supply switching was done slowly, so that the regulating loop could compensate. But this was not a perfect process, switches are difficult to make and their behavior is not predictable.

An idea underlying embodiments is active compensation. Thereby, a glitch when changing current measurement ranges is anticipated and injected into the control loop, e.g. as performed by apparatus 100 or 300. For example, a compensation signal compensating or counteracting the anticipated glitch is injected into the control loop.

An objective underlying embodiments of this invention is to minimize the voltage glitch at the DUT. The anticipated voltage change (or a signal compensating or counteracting the voltage change) at range-resistors (for example, at the switchable resistor) of apparatus 300 is fed into the regulator and/or DAC/amplifier (controlled source), in a way that the voltage step of the amplifier cancels out the voltage change at the range-resistors.

A further idea underlying embodiments is to make a transition slower. It has been found that it is difficult to synchronize glitch suppression injection and switching, therefore, it is favorable to obtain timing tolerance.

To obtain timing tolerance a capacitor holds a voltage at the current measurement shunts (switchable resistor 320) (or delays a voltage change). A glitch suppression gets a meaningful improvement of timing tolerance, as the glitch suppression is no longer instantaneously but distributed over a longer time frame. For example, by obtaining timing tolerance using the capacitor, requirements for the glitch suppression are relaxed. With switch $S_p$ a precharge (for example, of the capacitor) is possible to connect/disconnect (or to allow for connection/disconnection of) the capacitance without glitch when operating switch $S_c$.

Summarizing, effects of operating switches in a power supply can be minimized by injection of a glitch suppression into a regulator of a power supply. This means, that the output voltage change (for example, the change of the output voltage of the controlled source) is steered, not regulated (for example, at the point in time when the state of the switchable resistor is changed).

Alternatively or in addition, to relax timing requirements a (switchable) capacitor 490 bridging the shunt resistors 320 can be applied. Due to the capacitance's property to hold its voltage, the glitch suppression is (or can be) injected over a longer timeframe and not (necessarily) instantaneously.

Optionally, precharging of the capacitor allows to connect and disconnect the capacitor from the network without glitch.

In the following, some optional implementation details and examples will be described.

In the following, an up-ranging will be described as an example for changing the switching state of the switchable resistor.

Generally, up-ranging is a change of the measurement shunt to a higher current range, e.g. from 1 mA to 10 mA. Referring to circuit 500 of FIG. 5, Range 1 is 10 mA with R1=11Ω, Range 2 is 1 mA with R2=110Ω.

A starting point for up-ranging may be, when S2 is closed and S1 is open (i.e. a stationary state) and $I_0$=1 mA than $I_c$ is zero, wherein a stationary state $I_0$ entirely or majorly flows through R2. Moreover, before switching the capacitor C is loaded. S1 is still open and S2 closed:

$$V_C = V_{S0} = I_0 R_2$$

Than S1 is closed, directly after switching one obtains, using $$R_M = \frac{R_1 R_2}{R_1 + R_2};$$

$$I_C = \frac{R_M I_0 - V_C}{R_C + R_M}$$

$$V_{S1} = \frac{R_M}{R_M + R_C}(I_0 R_C + V_C).$$

After relaxation (i.e. discharging of the capacitor C) one obtains $V_{S\infty} = R_M I_0$ A time constant is $\tau = (R_M + R_C)C$ describing the time for discharging.

And the voltage over the circuit 500 behaves according to:
$V_S(t) = V_{S\infty} + (V_{S1} - V_{S\infty})e^{-t/\tau}$ Summarizing, the voltage at the circuit will have two phases after closing S2:

An instantaneous voltage drop $$V_{DROP} = V_{S0} - V_{S1}$$

Followed by an exponential slope with $$V'_S(t) = \frac{-(V_{S1} - V_{S\infty})}{\tau} e^{-t/\tau}.$$

These two contributions will be used for the glitch suppression functions (i.e. compensation signal) will be fed into the PID-Controller (wherein the D relating to differential is not used in the controller/regulator). Moreover, if only an integrator is used, then the voltage drop may be differentiated before input to the regulator.

In the following, an example of an injected glitch suppression, which can be used for up-ranging, will be described taking references to FIG. 7 and FIG. 8.

To compensate for Voltage Steps or linear effects injection of a constant value is used for one clock cycle (Step) or continuous (linear).

Furthermore, to compensate for exponential effects (RC-discharge) an exponential term is generated with a feedback loop having a factor between "0" and "1".

Both contributions (voltage drop and exponential term) are added as illustrated in block diagram 700.

FIG. 8 shows the generation of the compensation for "ramp up". The exponential compensation is stopped, when the target value is reached. Then the compensation is stopped and the switch for the smaller range is opened.

FIG. 9 shows a resulting behavior at the DUT (for example, in the case of up-ranging). In this example the voltage at the shunt network is reduced from 110 mV to 11 mV. The DUT-voltage glitches with <1 mV.

In the following, some optional details regarding a down-ranging will be described.

Generally, down-ranging is the change of the measurement to a smaller current range, e.g. from 1 A to 1 mA. Therefore, we will consider Range 1 of circuit 500 as the 1 A range and Range 2 of circuit 500 as the 1 mA range.

A starting point is, considering circuit 500, that S1 is closed and S2 is open. An idea underlying embodiments is that when S1 is open, the current continues to flow loading the Capacitor. The voltage increase at the Capacitor is compensated with a higher amplifier voltage, holding the voltage at the DUT at the same level. When the Capacitor voltage reaches the target voltage S2 is closed and the increase of the amplifier voltage is stopped.

Therefore, before switching, the Capacitor is loaded to its start value.

S1 is closed, S2 is open:

$$V_{C1} = I_0 R_1$$

S1 is opened, the capacitor is loaded with $I_0$:

$$V_C(t) = V_{C1} + \frac{1}{C}\int I_0 dt = V_{C1} + \frac{I_0}{C}t$$

The integration may be stopped when $V_{C2} = I_0 R_2$.

Therefore, a time for integration can be determined as $$\Delta t = C\frac{(V_{C2} - V_{C1})}{I_0} = C\frac{I_0(R_2 - R_1)}{I_0} = C(R_2 - R_1)$$

During this time the output voltage of the amplifier is changed with $$V'(t) = \frac{I_0}{C}.$$

In the following an example of an injected glitch suppression signal will be described.

During the switching an additional contribution, rectangular signal of graph 1000 of FIG. 10, is injected to the integrator. This compensates the increasing voltage at the capacitor with an increasing voltage at the amplifier.

Result: The Voltage at the DUT does not change (substantially).

FIG. 11 shows the resulting behavior at the DUT (for example describing a down-ranging). In this example the voltage at the shunt network has to be increased from 0.1 mV to 110 mV. The DUT-voltage glitches with less than 1 mV.

Summarizing, if a current measurement shunt is changed, the voltage at this circuit is changing. Using a by-pass Capacitor and/or a "anti-glitch-injection" in the controller a glitch at the DUT can be avoided (or at least reduced). Ideally, the glitch is completely cancelled and the voltage at the DUT does not change. The voltage regulation can continue and perform a final adjust.

Summarizing Up- and Down-Ranging:

Up-Ranging: Voltage-step due to additional resistor and exponential relaxation of Capacitor voltage.

Down-ranging: Linear integration of capacitor voltage.

In the following, some further aspects of embodiments of the invention will be described, which can be used individually or in combination with any of the other embodiments described herein.

According to aspects of the invention the change of shunt resistors for current measurement within a power supply becomes possible theoretically without any glitch.

According to embodiments, within a digitally controlled loop a steering of a compensation can be done very accurate and repeatable. Even a calibration is possible, which may not be possible in an analog approach.

Embodiments describe a combination of active compensation and a parallel capacitor allowing for robust compensation. A digital control provides accurate values, the capacitor, which can be removed for normal operation, allows better control of timing, as an instantaneous effect is transformed to a longer period.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

Implementation Alternatives

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The methods described herein, or any components of the apparatus described herein, may be performed at least partially by hardware and/or by software.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An apparatus for testing, the apparatus comprising:
a circuit operable to provide a supply voltage to a device under test, the circuit comprising:
  a controlled source configured to provide a voltage at an output based on one or more control signals;
  a switchable resistor coupled between the output of the controlled source and a device under test, the switchable resistor having a first resistance in a first switch state and a second resistance in a second switch state, wherein the second resistance is smaller than the first resistance; and
  a regulator configured to provide a first control signal to the controlled source, wherein the regulator is further configured to regulate a voltage provided to the device under test based on an information about a desired voltage,
  wherein the circuit is configured to change a switch state of the switchable resistor while a voltage is provided to the device under test via the switchable resistor, and
  wherein the circuit is further configured to inject a compensation signal into a control loop comprising the regulator, the controlled source and the switchable resistor to change the voltage provided by the controlled source and to partially compensate a change of a voltage drop across the switchable resistor, wherein the change in the voltage drop is responsive to a changing of the switch state of the switchable resistor, and wherein the compensation signal is injected into the control loop between the regulator and the controlled source.

2. The apparatus according to claim 1, wherein the circuit is further configured to inject a negative compensation signal into the control loop to decrease an output voltage of the controlled source when switching the switchable resistor from the first resistance of the first switch state to the second resistance of the second switch state.

3. The apparatus according to claim 1, wherein the circuit is further configured to inject a positive compensation signal into the control loop to increase an output voltage of the controlled source when switching the switchable resistor from the second resistance of the second switch state to the first resistance of the first switch state.

4. The apparatus according to claim 1, wherein the circuit is further configured to inject the compensation signal into a digital part of the control loop.

5. The apparatus according to claim 1, wherein the circuit is further configured to add the compensation signal to an error signal of the control loop, and wherein the circuit is further configured to provide the error signal to the regulator.

6. The apparatus according to claim 1, wherein the circuit is further configured to inject the compensation signal into the control loop, wherein the compensation signal is electrically transparent to a port of the device under test port and wherein the compensation signal indirectly partially compensates a change of a voltage drop across the switchable resistor caused by changing a switch state of the switchable resistor.

7. The apparatus according to claim 1, wherein the switchable resistor comprises a first switch coupled in series with a first resistor comprising the first resistance; and
  a second switch coupled in series with a second resistor comprising the second resistance,
  wherein the switchable resistor is configured to close the first switch and open the second switch in the first switch state, and
  wherein the switchable resistor is configured to open the first switch and close the second switch in the second switch state, and
  wherein the switchable resistor is configured to allow the first resistor and the second resistor to be coupled in parallel in an intermediate switch state when the first switch and the second switch are closed.

8. The apparatus according to claim 1, wherein the circuit comprises a capacitor coupled in parallel to the switchable resistor at least during a changing of a switch state of the switchable resistor.

9. The apparatus according to claim 8, wherein the circuit is further configured to set a voltage of the capacitor to a value equal to a voltage drop across the switchable resistor while the switchable resistor is in a stationary stage.

10. The apparatus according to claim 8, wherein the circuit is further configured to parallel-couple the capacitor with the switchable resistor via a resistor comprising a resistance value which is larger than or equal to ten times a resistance of the switchable resistor in a stationary state of the switchable resistor prior to switching a state of the switchable resistor.

11. The apparatus according to claim 8, wherein the circuit is further configured to couple the capacitor in parallel with the switchable resistor via an electrical path comprising a resistor in series with the capacitor, wherein a resistance value of the resistor is at most a tenth of a smaller one of the first resistance of the first switch state and of the second resistance in the second switch state.

12. The apparatus according to claim 8, wherein the circuit is further configured to decouple the capacitor from the switchable resistor in a stationary state of the switchable resistor, and wherein the circuit comprises a measurement unit configured to measure a voltage across the switchable resistor, when the capacitor is decoupled.

13. The apparatus according to claim 8, wherein the circuit is further configured to couple the capacitor in parallel to the switchable resistor via an electrical path with a low resistance value during switching of the switchable resistor, and wherein the capacitor has a capacitance configured to slow a voltage change at a port of the device under test when switching the switchable resistor, wherein the voltage change is substantially inhibited at the port of the device under test port based on the first control signal.

14. The apparatus according to claim 8, wherein the circuit is further configured to inject a compensation signal comprising an exponential decay component and an overshoot at a beginning of the exponential decay, wherein the overshoot is configured to compensate a voltage step caused by the switchable resistor when switching the switchable resistor, and wherein the exponential decay component of the compensation is signal is configured to at least partially compensate a temporally transient voltage of the capacitor.

15. The apparatus according to claim 8, wherein the switchable resistor is configured to switch from the first switch state, in which the first resistance is effective, to the second switch state, in which the second resistance is effective, via an intermediate switch state in which a resistance smaller than the second resistance is effective, wherein the circuit is configured to inject a compensation signal comprising an exponential decay and an overshoot at a beginning of the exponential decay into an integrating portion of the regulator when switching from the first switch state to the second switch state, wherein the overshoot is configured to at least partially compensate a voltage step caused by switching the switchable resistor from the first switch state to the intermediate switch state, and wherein a component of the compensation signal associated with the exponential decay is configured to at least partially compensate a temporally transient voltage across the capacitor.

16. The apparatus according to claim 8, wherein the switchable resistor is configured to switch from the second switch state, in which the second resistance is effective, to the first switch state, in which the first resistance is effective, via an intermediate switch state in which an effective resistance is larger than the first resistance, wherein the circuit is configured to inject a compensation signal of a rectangular shape into an integrating portion of the regulator when switching from the second switch state to the first switch state to at least partially compensate a temporally transient voltage across the capacitor.

17. The apparatus according to claim 8, wherein the switchable resistor comprises an intermediate switch state, wherein an effective resistance in the intermediate switch state is larger than the first resistance and the second resistance, and wherein the circuit is configured to switch the switchable resistor into the intermediate switch state in between switching from the second switch state to the first switch state.

18. The apparatus according to claim 8, wherein the circuit is further configured to discharge the capacitor when switching from the first switch state to the second switch state and to charge the capacitor when switching from the second switch state to the first switch state, wherein a change of an output voltage of the controlled source at least partially compensates a change of the voltage across the capacitor.

19. The apparatus according to claim 1, wherein the switchable resistor comprises an intermediate switch state, wherein an effective resistance in the intermediate switch state is smaller than the first resistance and the second resistance, and wherein the circuit is configured to switch the switchable resistor into the intermediate switch state in between switching from the first switch state to the second switch state.

20. The apparatus according to claim 1, wherein the circuit comprises a measurement unit configured to measure a voltage across the switchable resistor.

21. The apparatus according to claim 1, wherein the circuit is further configured to provide the first control signal from the regulator based on an error signal, wherein the error signal is based on a difference between a measured voltage at a port of the device under test and information about a desired voltage.

22. The apparatus according to claim 21, wherein the regulator is configured to provide the control signal using an integration of the error signal.

23. The apparatus according to claim 1, wherein the controlled source is configured to provide an output voltage based on the control signal in a current state, wherein, through a feedback over the control loop, an absolute value of the error signal is reduced in a future state.

24. A method of providing a supply voltage to a device under test, the method comprising:

providing a voltage based on one or more control signals from a controlled source, wherein a switchable resistor is coupled between an output of the controlled source and a device under test port, wherein the switchable resistor comprises a first resistance in a first switch state and a second resistance in a second switch state, wherein the second resistance is smaller than the first resistance;

providing a first control signal from a regulator to the controlled source to regulate a voltage to be provided to the device under test based on an information about a desired voltage;

changing a switch state of the switchable resistor while a voltage is provided to the device under test via the switchable resistor;

injecting a compensation signal into a control loop comprising the regulator, the controlled source and the switchable resistor, to cause a voltage change of the voltage provided by the controlled source, and wherein the compensation signal is injected into the control loop between the regulator and the controlled source; and at least partially compensating a change of a voltage drop across the switchable resistor which is responsive to changing the switch state of the switchable resistor.

* * * * *